US012695420B1

(12) United States Patent
Ziazadeh et al.

(10) Patent No.: US 12,695,420 B1
(45) Date of Patent: Jul. 28, 2026

(54) METHODS, APPARATUS, AND SYSTEMS FOR A MULTI-BAND HYBRID INDUCTOR-CAPACITOR VOLTAGE-CONTROLLED OSCILLATOR

(71) Applicant: Texas Instruments Incorporated, Dallas, TX (US)

(72) Inventors: Ramsin Ziazadeh, San Jose, CA (US); Sonam Sadhukhan, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 19/040,338

(22) Filed: Jan. 29, 2025

(51) Int. Cl.
| | |
|---|---|
| *H03B 5/12* | (2006.01) |
| *H03L 7/093* | (2006.01) |
| *H03L 7/099* | (2006.01) |

(52) U.S. Cl.
CPC ........... *H03B 5/1206* (2013.01); *H03L 7/093* (2013.01); *H03L 7/099* (2013.01)

(58) Field of Classification Search
CPC .................................................... H03B 5/1206
USPC ...................................................... 331/117 FE
See application file for complete search history.

(56) References Cited

U.S. PATENT DOCUMENTS

| | | | | |
|---|---|---|---|---|
| 6,867,658 B1 * | 3/2005 | Sibrai | .................. | H03B 5/1215 331/185 |
| 9,124,194 B2 * | 9/2015 | Feldtkeller | .......... | H02M 7/5387 |

OTHER PUBLICATIONS

R R et al. "A High Performance Switchable Multiband Inductor Structure for LC-VCOs," 2017 30th International Conference on VLSI Design and 2017 16th International Conference on Embedded Systems, 2017, 6 pages.

* cited by examiner

*Primary Examiner* — Joseph Chang
(74) *Attorney, Agent, or Firm* — Xianghui Huang; Frank D. Cimino

(57) ABSTRACT

An example apparatus includes an inverter having a first terminal and a second terminal coupled to an enable terminal. The apparatus includes a first transistor having a control terminal, a first terminal, and a second terminal, the control terminal coupled to the first terminal of the inverter, the first terminal coupled to a supply terminal. The apparatus includes a second transistor having a control terminal, a first terminal, and a second terminal, the first terminal coupled to the second terminal of the first transistor. The apparatus includes an inductor having a first terminal coupled to the second terminal of the second transistor and a second terminal coupled to the control terminal of the second transistor. The apparatus includes a capacitor having a first terminal coupled to the second terminal of the second transistor and a second terminal coupled to the control terminal of the second transistor. The apparatus includes a third transistor having a control terminal, a first terminal, and a second terminal, the control terminal coupled to the first terminal of the inductor and the first terminal of the capacitor, the second terminal coupled to the second terminal of the inductor and the second terminal of the capacitor. The apparatus includes a fourth transistor having a control terminal coupled to the enable terminal, a first terminal coupled to a ground terminal, and a second terminal coupled to the first terminal of the third transistor.

20 Claims, 16 Drawing Sheets

FROM

METHODS, APPARATUS, AND SYSTEMS FOR A MULTI-BAND HYBRID INDUCTOR-CAPACITOR VOLTAGE-CONTROLLED OSCILLATOR

TECHNICAL FIELD

This description relates generally to oscillators and, more particularly, to methods, apparatus, and systems for a multi-band hybrid inductor-capacitor voltage-controlled oscillator.

BACKGROUND

An electronic oscillator produces a periodic, oscillating, or alternating current (AC) signal. For example, an electronic oscillator, or, more generally, an oscillator, produces a signal such as a sine wave, a square wave, or a triangle wave. Oscillators are used in a variety of applications such as receivers, transmitters, computers, peripheral devices, mobile devices, and televisions.

SUMMARY

For methods, apparatus, and systems for a multi-band hybrid inductor-capacitor voltage-controlled oscillator, an example apparatus includes an inverter having a first terminal and a second terminal coupled to an enable terminal. The apparatus includes a first transistor having a control terminal, a first terminal, and a second terminal, the control terminal coupled to the first terminal of the inverter, the first terminal coupled to a supply terminal. The apparatus includes a second transistor having a control terminal, a first terminal, and a second terminal, the first terminal coupled to the second terminal of the first transistor. The apparatus includes an inductor having a first terminal coupled to the second terminal of the second transistor and a second terminal coupled to the control terminal of the second transistor. The apparatus includes a capacitor having a first terminal coupled to the second terminal of the second transistor and a second terminal coupled to the control terminal of the second transistor. The apparatus includes a third transistor having a control terminal, a first terminal, and a second terminal, the control terminal coupled to the first terminal of the inductor and the first terminal of the capacitor, the second terminal coupled to the second terminal of the inductor and the second terminal of the capacitor. The apparatus includes a fourth transistor having a control terminal coupled to the enable terminal, a first terminal coupled to a ground terminal, and a second terminal coupled to the first terminal of the third transistor. Other examples are described.

For methods, apparatus, and systems for a multi-band hybrid inductor-capacitor voltage-controlled oscillator, an example inductor-capacitor (LC) oscillator includes a first inverter having a first terminal and a second terminal coupled to an enable terminal. The LC oscillator includes a first core including: a first transistor having a control terminal, a first terminal, and a second terminal, the control terminal coupled to the first terminal of the first inverter, the first terminal coupled to a supply terminal; a first LC tank circuit including a first inductor and a first capacitor, the first LC tank circuit having a first terminal and a second terminal across which a clock signal is to be measured; and a second transistor having a control terminal, a first terminal, and a second terminal, the control terminal coupled to the enable terminal, the first terminal coupled to a ground terminal. The LC oscillator includes a second inverter having a first terminal and a second terminal coupled to a tuning terminal. The LC oscillator includes a second core including: a third transistor having a control terminal, a first terminal, and a second terminal, the control terminal coupled to the first terminal of the second inverter, the first terminal coupled to the supply terminal; a fourth transistor having a control terminal, a first terminal, and a second terminal, the control terminal coupled to the first terminal of the first LC tank circuit, the first terminal coupled to the second terminal of the third transistor; a second LC tank circuit including a second inductor and a second capacitor, the second LC tank circuit having a first terminal and a second terminal, the first terminal coupled to the second terminal of the fourth transistor; and a fifth transistor having a control terminal, a first terminal, and a second terminal, the control terminal coupled to the second terminal of the first LC tank circuit, the second terminal coupled to the second terminal of the second LC tank circuit; and a sixth transistor having a control terminal coupled to the tuning terminal, a first terminal coupled to the ground terminal, and a second terminal coupled to the first terminal of the fifth transistor, the first inductor being inductively coupled via a mutual inductance to the second inductor. Other examples are described.

For methods, apparatus, and systems for a multi-band hybrid inductor-capacitor voltage-controlled oscillator, an example phase-locked loop (PLL) oscillator includes a phase comparator circuit having a terminal. The PLL oscillator includes a filter circuit having a first terminal and a second terminal coupled to the terminal of the phase comparator circuit. The PLL oscillator includes an inductor-capacitor (LC) voltage-controlled oscillator (VCO) including: an inverter having a first terminal and a second terminal coupled to the first terminal of the filter circuit; a first transistor having a control terminal, a first terminal, and a second terminal, the control terminal coupled to the first terminal of the inverter, the first terminal coupled to a supply terminal; a second transistor having a control terminal, a first terminal, and a second terminal, the first terminal coupled to the second terminal of the first transistor; an inductor having a first terminal coupled to the second terminal of the second transistor and a second terminal coupled to the second transistor; a capacitor having a first terminal coupled to the second terminal of the second transistor and a second terminal coupled to the control terminal of the second transistor; a third transistor having a control terminal, a first terminal, and a second terminal, the control terminal coupled to the first terminal of the inductor and the first terminal of the capacitor, the second terminal coupled to the second terminal of the inductor and the second terminal of the capacitor; and a fourth transistor having a control terminal coupled to the first terminal of the filter circuit, a first terminal coupled to a ground terminal, and a second terminal coupled to the first terminal of the third transistor. Other examples are described.

Figure 1:
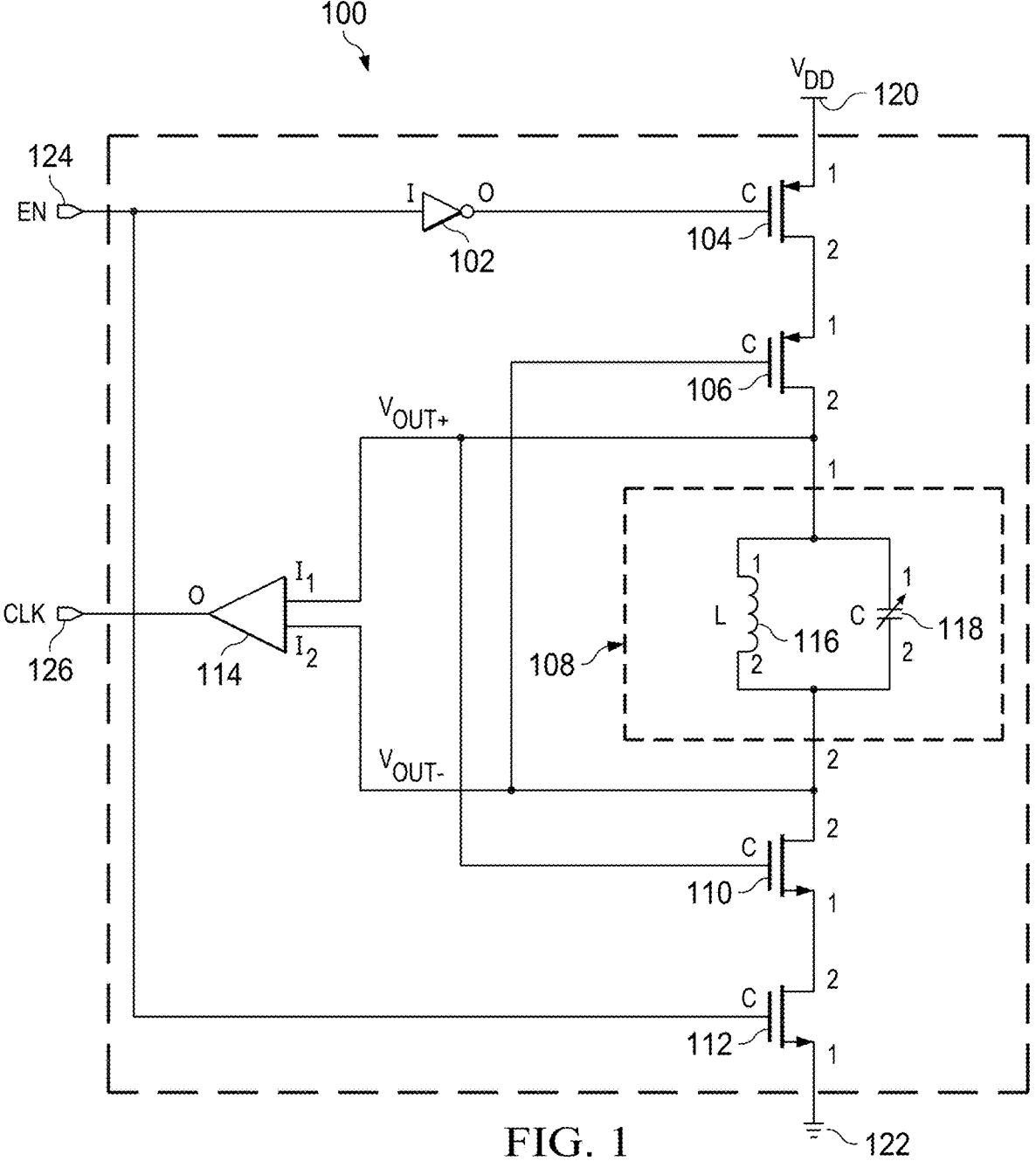
FIG. 1 is a schematic diagram of an example inductor-capacitor (LC) voltage-controlled oscillator (VCO).

The drawings are not necessarily to scale. Generally, the same reference numbers in the drawing(s) and this description refer to the same or similar (in terms of at least one of functional or structural) features or parts. Although the drawings show regions with clean lines and boundaries, some or all of these lines and boundaries may be idealized. In reality, the boundaries or lines may be unobservable, blended or irregular.

DETAILED DESCRIPTION

An oscillator can be implemented as a linear oscillator or a nonlinear oscillator. In some examples, a linear oscillator is referred to as a harmonic oscillator and a nonlinear oscillator is referred to as a relaxation oscillator. One type of linear oscillator is an inductor-capacitor (LC) oscillator. One type of LC oscillator includes a tuned circuit having an inductor coupled to a capacitor, which is referred to as an LC tank circuit. In an LC oscillator, the LC tank circuit acts as a resonator that allows charge to flow back and forth between the plates of the capacitor via the inductor. As such, the LC tank circuit can store electrical energy that oscillates at the resonant frequency of the LC tank circuit.

In some examples, the resonant frequency of the LC tank circuit, as well as the frequency of the oscillating signal, sometimes referred to as a clock signal, generated by the LC oscillator, can be tuned. For example, the resonant frequency of an LC tank circuit can be tuned by adjusting the capacitance, with coarse-grained or fine-grained control of capacitance, of the LC tank circuit to achieve a tuning range proportional to $1/\sqrt{LC}$ Also, frequency tuning of an LC tank circuit can be accomplished by tuning the inductance of the LC tank circuit. To tune the inductance of an LC tank circuit, two or more inductors are coupled to the capacitor in the LC tank circuit and a switch is placed in series with each of the two or more inductors of the LC tank circuit. The switches serve to selectively connect the inductors to the LC tank circuit, thereby tuning the LC tank circuit. Including switches in series with the two or more inductors affects the quality factor (Q) of the LC tank circuit.

Oscillators can also be controlled by an input voltage signal. For example, the frequency generated by a voltage-controlled oscillator (VCO) can vary, responsive to an input voltage signal, within a range defined by the architecture of the VCO. An LC VCO is an LC oscillator that is controlled by an input voltage signal that tunes the LC oscillator frequency. An LC VCO has a limited tuning range. For example, the tuning range of a single LC VCO may be between 1 and 1.5 gigahertz (GHz). Modern applications can require an oscillator that supports an operational frequency range between 4 GHz and 8 GHz.

As such, multiple LC VCOs may be required to support an operational frequency range wider than the tuning range of a single LC VCO. Implementing multiple LC VCOs requires a large amount of area on a chip and consumes a large amount of power. For example, implementing multiple LC VCOs requires a large amount of area on a chip to ensure that the LC VCOs remain physically separate from one another. Also, a high-speed multiplexer may be required to switch between the different clock signals generated by multiple LC VCOs which can result in clock distortion, clock jitter, routing complexity, and increased power consumption.

Some LC VCOs are designed with complementary metal-oxide-semiconductor (MOS) transistors. For example, one LC VCO is designed with two positive channel (p-channel) MOS (PMOS) transistors and two negative channel (n-channel) MOS (NMOS) transistors coupled in parallel with an LC tank circuit. As such, a large parasitic capacitance develops in the LC VCO because the four MOS transistors are coupled in parallel with the LC tank circuit.

Due to the increased parasitic capacitance, the inductance of the LC tank circuit must be reduced to achieve a target resonant frequency of the LC tank circuit. Thus, a characteristic impedance, $Z=\sqrt{LC}$, of the LC tank circuit is also reduced. For example, because each of the MOS transistors has limited output impedance, $$Z_O = \frac{1}{g_{ds}} = r_0,$$

the impedance of the LC tank circuit is reduced. As such, owing to the reduced LC tank circuit impedance, increased power is required to start the LC VCO and to maintain an amplitude of the clock signal generated by the LC VCO. Also, the efficiency of the LC VCO is reduced as a result of the parasitic capacitance developed in the LC VCO.

Examples described herein include a single-ended LC VCO stage that includes a differential output with reduced parasitic impedance and increased LC tank circuit imped-ance with respect to other LC VCOs described herein. Examples described herein also include one or more mir-roring stages, sometimes referred to as one or more periph-eral stages, that can be coupled to the single-ended LC-VCO stage, sometimes referred to as a main stage, to provide in-phase and out-of-phase current injection. For example, current can be injected into one or more LC tank circuits of the one or more peripheral stages where the one or more LC tank circuits are coupled to the LC tank circuit of the main stage via at least one of mutual inductance or mutual capacitance. As such, the inductance of the LC VCO can be tuned by changing the polarity of the injected current. Accordingly, the tuning capability of the LC VCO is extended to both tuning of inductance and capacitance.

In examples described herein, an LC tank circuit does not include any switches in series with the inductor of the LC tank circuit. As such, examples described herein do not impact the quality factor of LC tank circuits. Also, because example LC VCOs described herein include a single differ-ential output, multiplexing is not required at the outputs of described LC VCOs. As such, the performance of clock signals generated by example LC VCOs described herein is improved in terms of at least reduced duty-cycle distortion and reduced supply noise related jitters.

FIG. 1 is a schematic diagram of an example inductor-capacitor (LC) voltage-controlled oscillator (VCO) 100. In the example of FIG. 1, the LC VCO 100 includes an example inverter 102, a first example transistor 104, a second example transistor 106, an example inductor-capaci-tor (LC) tank circuit 108, a third example transistor 110, a fourth example transistor 112, and an example buffer 114. Also, the example LC tank circuit 108 includes an example inductor 116 and an example capacitor 118. In the example of FIG. 1, the LC VCO 100 also includes an example supply terminal 120, an example ground terminal 122, an example enable terminal 124, and an example clock terminal 126. In some examples, the supply terminal 120 is referred to as at least one of $V_{DD}$ or a voltage terminal and the ground terminal 122 is referred to as at least one of GND or a voltage terminal.

In the illustrated example of FIG. 1, the inverter 102 has an input and an output. In the example of FIG. 1, each of the transistor 104, the transistor 106, the transistor 110, and the transistor 112 has a control terminal, a first terminal, and a second terminal. In some example, the control terminal, the first terminal, and the second terminal of a transistor are referred to as a gate terminal, a source terminal, and a drain terminal of the transistor, respectively. Also, each of the LC tank circuit 108, the inductor 116, and the capacitor 118 has a first terminal and a second terminal. In the example of FIG. 1, the buffer 114 has a first input, a second input, and an output.

In the illustrated example of FIG. 1, the inverter 102 is implemented by at least one of analog or digital circuitry. In the example of FIG. 1, the input of the inverter 102 is coupled to the enable terminal 124. Also, the output of the inverter 102 is coupled to the control terminal of the transistor 104.

In the illustrated example of FIG. 1, the transistor 104 is implemented by a PMOS transistor. In the example of FIG. 1, the control terminal of the transistor 104 is coupled to the output of the inverter 102, the first terminal of the transistor 104 is coupled to the supply terminal 120, and the second terminal of the transistor 104 is coupled to the first terminal of the transistor 106. Also, in the example of FIG. 1, the transistor 106 is implemented by a PMOS transistor. In the example of FIG. 1, the control terminal of the transistor 106 is coupled to the second terminal of the LC tank circuit 108, the first terminal of the transistor 106 is coupled to the second terminal of the transistor 104, and the second termi-nal of the transistor 106 is coupled to the first terminal of the LC tank circuit 108.

In the illustrated example of FIG. 1, the first terminal of the LC tank circuit 108 is implemented by the first terminal of the inductor 116 and the first terminal of the capacitor 118. Also, the second terminal of the LC tank circuit 108 is implemented by the second terminal of the inductor 116 and the second terminal of the capacitor 118. In the example of FIG. 1, the first terminal of the LC tank circuit 108 is coupled to the second terminal of the transistor 106, the control terminal of the transistor 110, and the first input of the buffer 114. Also, the second terminal of the LC tank circuit 108 is coupled to the control terminal of the transistor 106, the second terminal of the transistor 110, and the second input of the buffer 114.

In the illustrated example of FIG. 1, the first terminal of the inductor 116 is coupled to the second terminal of the transistor 106, the control terminal of the transistor 110, the first input of the buffer 114, and the first terminal of the capacitor 118. Also, the second terminal of the inductor 116 is coupled to the control terminal of the transistor 106, the second terminal of the transistor 110, the second input of the buffer 114, and the second terminal of the capacitor 118. In the example of FIG. 1, the capacitor 118 is a tunable capacitor. To tune the capacitance of the capacitor 118, two or more capacitors are coupled in parallel to the implement the capacitor 118 and a switch is placed in series with each of the two or more capacitors.

As such, one or more of the switches can be toggled on or off to increase or decrease the capacitance of the capacitor 118. In the example of FIG. 1, the first terminal of the capacitor 118 is coupled to the second terminal of the transistor 106, the control terminal of the transistor 110, first input of the buffer 114, and the first terminal of the inductor 116. Also, the second terminal of the capacitor 118 is coupled to the control terminal of the transistor 106, the second terminal of the transistor 110, the second input of the buffer 114, and the second terminal of the inductor 116.

In the illustrated example of FIG. 1, the transistor 110 is implemented by an NMOS transistor. In the example of FIG. 1, the control terminal of the transistor 110 is coupled to the first terminal of the LC tank circuit 108, the first terminal of the transistor 110 is coupled to the second terminal of the transistor 112, and the second terminal of the transistor 110 is coupled to the second terminal of the LC tank circuit 108. Also, in the example of FIG. 1, the transistor 112 is implemented by an NMOS transistor. In the example of FIG. 1, the control terminal of the transistor 112 is coupled to the enable terminal 124, the first terminal of the transistor 112 is coupled to the ground terminal 122, and the second terminal of the transistor 112 is coupled to the first terminal of the transistor 110.

In the illustrated example of FIG. 1, the buffer 114 is implemented by at least one of analog or digital circuitry. In the example of FIG. 1, the first input of the buffer 114 is coupled to the first terminal of the LC tank circuit 108 and the second input of the buffer 114 is coupled to the second terminal of the LC tank circuit 108. Also, the output of the buffer 114 is coupled to the clock terminal 126.

In example operation, the LC VCO 100 operates responsive to an enable signal at the enable terminal 124. For example, the LC tank circuit 108 generates, or is to generate, an oscillating signal responsive to an enable signal at the enable terminal 124. In the example of FIG. 1, the enable signal is a binary signal. Responsive to a logic value of one at the enable terminal 124, the LC VCO 100 is enabled, and the LC VCO 100 generates a clock signal at the clock terminal 126. Also, responsive to a logic value of zero at the enable terminal 124, the LC VCO 100 is disabled, and the LC VCO 100 does not generate a clock signal at the clock terminal 126. In some examples, a logic value of one refers to at least one of a value of "1", a logic high value, or a five volt (V) signal. Also, in some examples, a logic value of zero refers to at least one of a value of "0", a logic low value, or 0 V signal.

In the illustrated example of FIG. 1, when the LC VCO 100 is enabled, the LC tank circuit 108 generates a differential output signal $V_{OUT}$ that oscillates at a resonant frequency of the LC tank circuit 108. For example, the differential output signal $V_{OUT}$ is measured between the first terminal of the LC tank circuit 108, also referred to as $V_{OUT+}$, and the second terminal of the LC tank circuit 108, also referred to as $V_{OUT-}$. In the example of FIG. 1, the buffer 114 buffers the differential output signal $V_{OUT}$ from the LC tank circuit 108 and provides the clock signal at the clock terminal 126 responsive to the differential output signal VOLT. For example, the clock signal generated at the clock terminal 126 has the same frequency as the differential output signal $V_{OUT}$ from the LC tank circuit 108.

In the illustrated example of FIG. 1, the LC VCO 100 is a low overhead LC VCO as compared to other LC VCOs. For example, the LC VCO 100 includes few components than other LC VCOs. In the example of FIG. 1, the LC VCO 100 includes two transistors cross coupled with the LC tank circuit 108. For example, the transistor 106 and the transistor 110 are cross coupled with the LC tank circuit 108. Also, the terminals at which the transistor 106 and the transistor 110 are cross coupled with the LC tank circuit 108 serve as the differential outputs of the LC tank circuit 108. As such, the LC VCO 100 provides improved common-mode noise rejection as compared to other LC VCOs.

In the illustrated example of FIG. 1, by reducing the number of transistors coupled across the LC tank circuit, for example from four to two, as compared to other LC VCOs, parasitic capacitance developed in the LC VCO 100 is reduced by two times as compared to other LC VCOs. As such, the inductor 116 can have a larger inductance while achieving a target resonant frequency of the LC tank circuit 108 as compared to other LC VCOs. Thus, a characteristic impedance, $Z=\sqrt{LC}$, of the LC tank circuit 108 is also increased. As a result, the amount of power, or current for a constant supply voltage, required to start the LC VCO 100 and to maintain an amplitude of the clock signal generated by the LC VCO 100 is reduced as compared to other LC VCOs. Also, the efficiency of the LC VCO 100 is improved as a result of the reduced parasitic capacitance developed in the LC VCO 100.

In the illustrated example of FIG. 1, the transistor 104 and the transistor 106 are p-channel metal-oxide semiconductor field-effect transistors (MOSFETs). Alternatively, the transistor 104 and the transistor 106 may be p-channel field-effect transistors (FETs), p-channel insulated-gate bipolar transistors (IGBTs), p-channel junction field effect transistors (JFETs), positive-negative-positive (PNP) bipolar junction transistors (BJTs), or, with slight modifications, n-type equivalent devices. In the example of FIG. 1, the transistor 110 and the transistor 112 are n-channel MOSFETs. Alternatively, the transistor 110 and the transistor 112 may be n-channel FETs, n-channel IGBTs, n-channel JFETs, negative-positive-negative (NPN) BJTs, or, with slight modifications, p-type equivalent devices. The transistor 104, the transistor 106, the transistor 110, and the transistor 112 may be depletion mode devices, drain-extended devices, enhancement mode devices, natural transistors or other type of device structure transistors. Furthermore, the transistor 104, the transistor 106, the transistor 110, and the transistor 112 may be implemented in/over a silicon (Si) substrate, a silicon carbide (SIC) substrate, a gallium nitride (GaN) substrate, or a gallium arsenide (GaAs) substrate.

Figure 2:
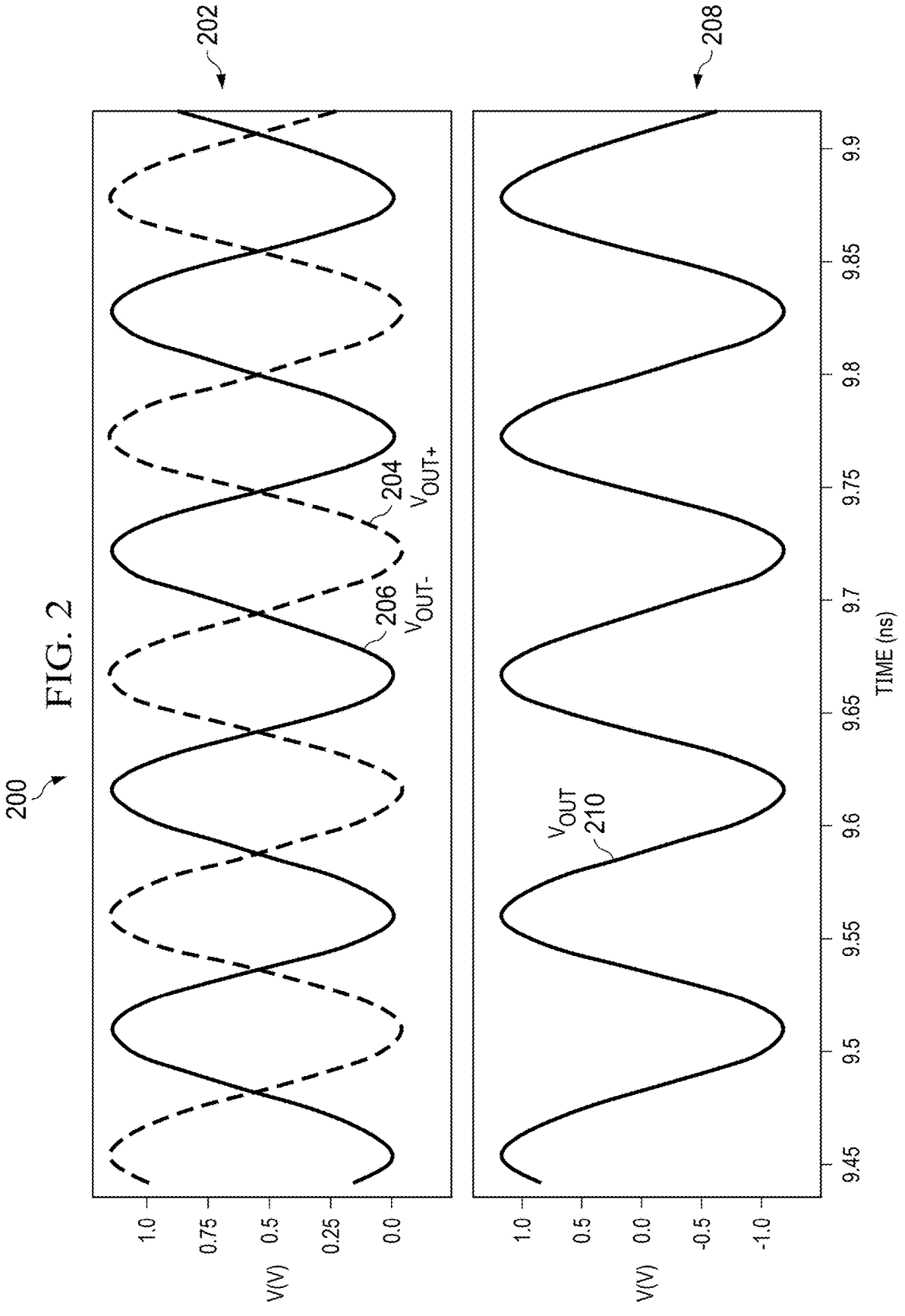
FIG. 2 is a graphical illustration of a first example graph depicting oscillating signals at the first terminal and the second terminal of the LC tank circuit of FIG. 1 and a second example graph depicting the differential output signal from the LC tank circuit of FIG. 1.

FIG. 2 is a graphical illustration of a first example graph 202 depicting a first example oscillating signal 204, also referred to as $V_{OUT+}$, at the first terminal and a second example oscillating signal 206, also referred to as $V_{OUT-}$, at the second terminal of the LC tank circuit 108 of FIG. 1 and a second example graph 208 depicting an example differential output signal 210, also referred to as $V_{OUT}$, from the LC tank circuit 108 of FIG. 1. In the example of FIG. 2, the graph 202 depicts voltages of $V_{OUT}+$ and $V_{OUT-}$ in volts versus time in nanoseconds (ns). Also, in the example of FIG. 2, the graph 208 depicts a voltage of $V_{OUT}$ from the LC tank circuit 108 in volts versus time in nanoseconds.

Figure 3:
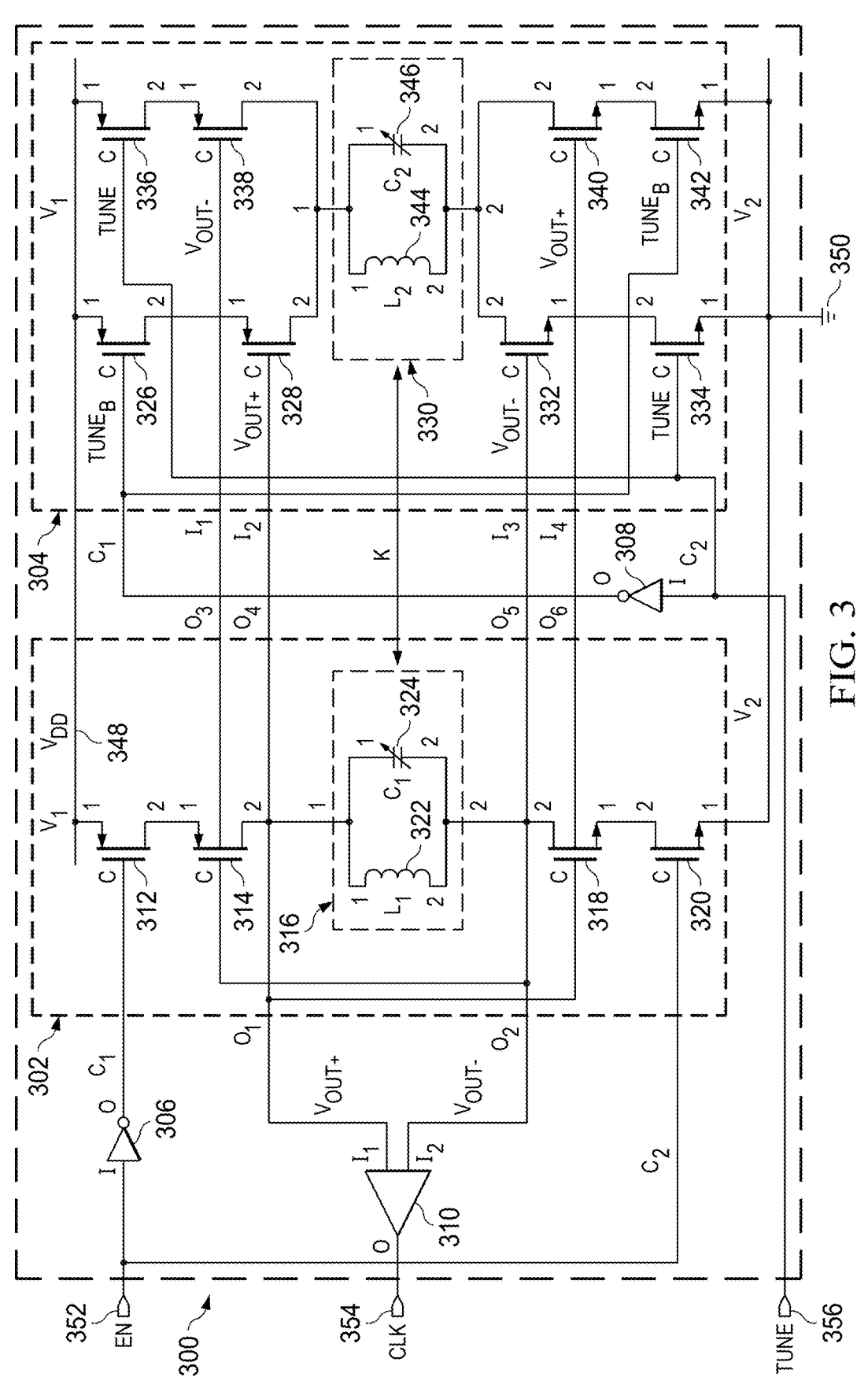
FIG. 3 is a schematic diagram of an example LC VCO including an example main core and an example peripheral core.

FIG. 3 is a schematic diagram of an example LC VCO 300 including an example main core 302 and an example peripheral core 304. In the example of FIG. 3, the LC VCO 300 also includes a first example inverter 306, a second example inverter 308, and an example buffer 310. In the example of FIG. 3, the main core 302, also referred to as a first core, includes a first example transistor 312, a second example transistor 314, a first example inductor-capacitor (LC) tank circuit 316, a third example transistor 318, and a fourth example transistor 320. Also, the example LC tank circuit 316 includes a first example inductor 322 and a first example capacitor 324.

In the illustrated example of FIG. 3, the peripheral core 304, also referred to as a second core, includes a fifth example transistor 326, a sixth example transistor 328, a second example LC tank circuit 330, a seventh example transistor 332, an eighth example transistor 334, a ninth example transistor 336, a tenth example transistor 338, an eleventh example transistor 340, and a twelfth example transistor 342. In the example of FIG. 3, the example LC tank circuit 330 includes a second example inductor 344 and a second example capacitor 346. Also, in the example of FIG. 3, the LC VCO 300 includes an example supply terminal 348, an example ground terminal 350, an example enable terminal 352, an example clock terminal 354, and an example tuning terminal 356. In some examples, the supply terminal 348 is referred to as at least one of $V_{DD}$ or a voltage terminal and the ground terminal 350 is referred to as at least one of GND or a voltage terminal.

In the illustrated example of FIG. 3, the main core 302 has a first voltage terminal, a second voltage terminal, a first control terminal, a second control terminal, a first output, a second output, a third output, a fourth output, a fifth output, and a sixth output. In the example of FIG. 3, the peripheral core 304 has a first voltage terminal, a second voltage terminal, a first control terminal, a second control terminal, a first input, a second input, a third input, and a fourth input.

Also, in the example of FIG. 3, each of the inverter 306 and the inverter 308 has an input and an output.

In the illustrated example of FIG. 3, each of the transistor 312, the transistor 314, the transistor 318, the transistor 320, the transistor 326, the transistor 328, the transistor 332, the transistor 334, the transistor 336, the transistor 338, the transistor 340, and the transistor 342 has a control terminal, a first terminal, and a second terminal. In some example, the control terminal, the first terminal, and the second terminal of a transistor are referred to as a gate terminal, a source terminal, and a drain terminal of the transistor, respectively. Also, each of the LC tank circuit 316, the inductor 322, the capacitor 324, the LC tank circuit 330, the inductor 344, and the capacitor 346 has a first terminal and a second terminal. In the example of FIG. 3, the buffer 310 has a first input, a second input, and an output.

In the illustrated example of FIG. 3, the first terminal of the transistor 312 operates as the first voltage terminal of the main core 302 and the first terminal of the transistor 320 operates as the second voltage terminal of the main core 302. Also, the control terminal of the transistor 312 operates as the first control terminal of the main core 302 and the control terminal of the transistor 320 operates as the second control terminal of the main core 302. In the example of FIG. 3, the first terminal of the LC tank circuit 316 operates as the first output, the fourth output, and the sixth output of the main core 302 and the second terminal of the LC tank circuit 316 operates as the second output, the third output, and the fifth output of the main core 302.

In the illustrated example of FIG. 3, the first terminal of the transistor 326 and the first terminal of the transistor 336 operate as the first voltage terminal of the peripheral core 304. In the example of FIG. 3, the first terminal of the transistor 334 and the first terminal of the transistor 342 operate as the second voltage terminal of the peripheral core 304. Also, the control terminal of the transistor 326 and the control terminal of the transistor 342 operate as the first control terminal of the peripheral core 304.

In the illustrated example of FIG. 3, the control terminal of the transistor 334 and the control terminal of the transistor 336 operate as the second control terminal of the peripheral core 304. In the example of FIG. 3, the control terminal of the transistor 338 operates as the first input of the peripheral core 304 and the control terminal of the transistor 328 operates as the second input of the peripheral core 304. Also, the control terminal of the transistor 332 operates as the third input of the peripheral core 304 and the control terminal of the transistor 340 operates as the fourth input of the peripheral core 304.

In the illustrated example of FIG. 3, the first voltage terminal of the main core 302 and the first voltage terminal of the peripheral core 304 are coupled to the supply terminal 348. In the example of FIG. 3, the second voltage terminal of the main core 302 and the second voltage terminal of the peripheral core 304 are coupled to the ground terminal 350. Also, the first control terminal of the main core 302 is coupled to the output of the inverter 306 and the second control terminal of the main core 302 is coupled to the enable terminal 352.

In the illustrated example of FIG. 3, the first control terminal of the peripheral core 304 is coupled to the output of the inverter 308 and the second control terminal of the peripheral core 304 is coupled to the tuning terminal 356. In the example of FIG. 3, the first output of the main core 302 is coupled to the first input of the buffer 310 and the second output of the main core 302 is coupled to the second input of the buffer 310. Also, the third output of the main core 302 is coupled to the first input of the peripheral core 304, the fourth output of the main core 302 is coupled to the second input of the peripheral core 304, the fifth output of the main core 302 is coupled to the third input of the peripheral core 304, and the sixth output of the main core 302 is coupled to the fourth input of the peripheral core 304.

In the illustrated example of FIG. 3, the inverter 306, the buffer 310, the transistor 312, the transistor 314, the LC tank circuit 316 including the inductor 322 and the capacitor 324, the transistor 318, the transistor 320, the supply terminal 348, the ground terminal 350, the enable terminal 352, and the clock terminal 354 are implemented and coupled in a similar manner as the components of the LC VCO 100 of FIG. 1 unless specified otherwise. In the example of FIG. 3, the inverter 308 is implemented by at least one of analog or digital circuitry. In the example of FIG. 3, the input of the inverter 308 is coupled to the tuning terminal 356 and the output of the inverter 308 is coupled to the control terminal of the transistor 326 and the control terminal of the transistor 342.

In the illustrated example of FIG. 3, the transistor 326 is implemented by a PMOS transistor. In the example of FIG. 3, the control terminal of the transistor 326 is coupled to the output of the inverter 308, the first terminal of the transistor 326 is coupled to the supply terminal 348, and the second terminal of the transistor 326 is coupled to the first terminal of the transistor 328. Also, in the example of FIG. 3, the transistor 328 is implemented by a PMOS transistor. In the example of FIG. 3, the control terminal of the transistor 328 is coupled to the first terminal of the LC tank circuit 316, the first terminal of the transistor 328 is coupled to the second terminal of the transistor 326, and the second terminal of the transistor 328 is coupled to the first terminal of the LC tank circuit 330.

In the illustrated example of FIG. 3, the transistor 336 is implemented by a PMOS transistor. In the example of FIG. 3, the control terminal of the transistor 336 is coupled to the tuning terminal 356, the first terminal of the transistor 336 is coupled to the supply terminal 348, and the second terminal of the transistor 336 is coupled to the first terminal of the transistor 338. Also, in the example of FIG. 3, the transistor 338 is implemented by a PMOS transistor. In the example of FIG. 3, the control terminal of the transistor 338 is coupled to the second terminal of the LC tank circuit 316, the first terminal of the transistor 338 is coupled to the second terminal of the transistor 336, and the second terminal of the transistor 338 is coupled to the first terminal of the LC tank circuit 330.

In the illustrated example of FIG. 3, the first terminal of the LC tank circuit 330 is implemented by the first terminal of the inductor 344 and the first terminal of the capacitor 346. Also, the second terminal of the LC tank circuit 330 is implemented by the second terminal of the inductor 344 and the second terminal of the capacitor 346. In the example of FIG. 3, the first terminal of the LC tank circuit 330 is coupled to the second terminal of the transistor 328 and the second terminal of the transistor 338. Also, the second terminal of the LC tank circuit 330 is coupled to the second terminal of the transistor 332 and the second terminal of the transistor 340.

In the illustrated example of FIG. 3, the first terminal of the inductor 344 is coupled to the second terminal of the transistor 328, the second terminal of the transistor 338, and the first terminal of the capacitor 346. Also, the second terminal of the inductor 344 is coupled to the second terminal of the transistor 332, the second terminal of the transistor 340, and the second terminal of the capacitor 346.

In the example of FIG. 3, the capacitor 346 is a tunable capacitor. To tune the capacitance of the capacitor 346, two or more capacitors are coupled in parallel to the implement the capacitor 346 and a switch is placed in series with each of the two or more capacitors.

As such, one or more of the switches can be toggled on or off to increase or decrease the capacitance of the capacitor 346. In the example of FIG. 3, the first terminal of the capacitor 346 is coupled to the second terminal of the transistor 328, the second terminal of the transistor 338, and the first terminal of the inductor 344. Also, the second terminal of the capacitor 346 is coupled to the second terminal of the transistor 332, the second terminal of the transistor 340, and the second terminal of the inductor 344.

In the illustrated example of FIG. 3, the transistor 332 is implemented by an NMOS transistor. In the example of FIG. 3, the control terminal of the transistor 332 is coupled to the second terminal of the LC tank circuit 316, the first terminal of the transistor 332 is coupled to the second terminal of the transistor 334, and the second terminal of the transistor 332 is coupled to the second terminal of the LC tank circuit 330. Also, in the example of FIG. 3, the transistor 334 is implemented by an NMOS transistor. In the example of FIG. 3, the control terminal of the transistor 334 is coupled to the tuning terminal 356, the first terminal of the transistor 334 is coupled to the ground terminal 350, and the second terminal of the transistor 334 is coupled to the first terminal of the transistor 332.

In the illustrated example of FIG. 3, the transistor 340 is implemented by an NMOS transistor. In the example of FIG. 3, the control terminal of the transistor 340 is coupled to the first terminal of the LC tank circuit 316, the first terminal of the transistor 340 is coupled to the second terminal of the transistor 342, and the second terminal of the transistor 340 is coupled to the second terminal of the LC tank circuit 330. Also, in the example of FIG. 3, the transistor 342 is implemented by an NMOS transistor. In the example of FIG. 3, the control terminal of the transistor 342 is coupled to the output of the inverter 308, the first terminal of the transistor 342 is coupled to the ground terminal 350, and the second terminal of the transistor 342 is coupled to the first terminal of the transistor 340.

In example operation, the LC VCO 300 operates responsive to an enable signal at the enable terminal 352 and a tuning signal at the tuning terminal 356. For example, the LC tank circuit 316 generates, or is to generate, an oscillating signal responsive to an enable signal at the enable terminal 352. In the example of FIG. 3, the enable signal is a binary signal. Responsive to a logic value of one at the enable terminal 352, the LC VCO 300 is enabled, and the LC VCO 300 generates a clock signal at the clock terminal 354. Also, responsive to a logic value of zero at the enable terminal 352, the LC VCO 300 is disabled, and the LC VCO 300 does not generate a clock signal at the clock terminal 354. In some examples, a logic value of one refers to at least one of a value of "1", a logic high value, or a five volt (V) signal. Also, in some examples, a logic value of zero refers to at least one of a value of "0", a logic low value, or 0 V signal.

In the illustrated example of FIG. 3, the inductor 322 is inductively coupled to the inductor 344 via a mutual inductance. For example, the magnetic field produced by current flowing through the inductor 344 induces a voltage across the inductor 322 and vice versa. In the example of FIG. 3, the amount of mutual inductance between the inductor 322 and the inductor 344 is based on a coupling factor K. For example, the larger the coupling factor K, the more the current flowing through the inductor 344 impacts the current flowing through the inductor 322. The amount of mutual inductance M between the inductor 322 and the inductor 344 can be computed as the product of (a) the coupling factor K and (b) the square root of the product of the inductance $L_1$ of the inductor 322 and the inductance $L_2$ of the inductor 344, $M = K\sqrt{L_1 * L_2}$.

As described herein, the LC VCO 300 operates responsive to the enable signal at the enable terminal 352 and the tuning signal at the tuning terminal 356. For example, the LC tank circuit 330 generates, or is to generate, an oscillating signal responsive to a tuning signal, also referred to as a control signal, at the tuning terminal 356. In the example of FIG. 3, the tuning signal is a binary signal. Responsive to a logic value of one at the tuning terminal 356, the transistor 326 is enabled, the transistor 336 is disabled, the transistor 334 is enabled, and the transistor 342 is disabled. For example, a transistor is enabled when the transistor conducts current and a transistor is disabled when the transistor does not conduct current.

Thus, current in the peripheral core 304 flows from the supply terminal 348 to the ground terminal 350 through the transistor 326, the transistor 328, the LC tank circuit 330, the transistor 332, and the transistor 334 responsive to the differential output signal $V_{OUT}$ from the LC tank circuit 316. As illustrated in FIG. 3, the control terminal of the transistor 314 is coupled to the second terminal of the LC tank circuit 316 and the control terminal of the transistor 328 is coupled to the first terminal of the LC tank circuit 316. Also, as illustrated in FIG. 3, the control terminal of the transistor 318 is coupled to the first terminal of the LC tank circuit 316 and the control terminal of the transistor 332 is coupled to the second terminal of the LC tank circuit 316.

Because the control terminals of the transistor 328 and the transistor 332 are coupled to the LC tank circuit 316 in an opposite manner as compared to the control terminals of the transistor 314 and the transistor 318, the peripheral core 304 injects current into the LC tank circuit 330 at different times than when the main core 302 injects current into the LC tank circuit 316. As such, the LC tank circuit 330 generates an oscillating signal, such as current, out-of-phase with an oscillating signal, such as current, generated by the LC tank circuit 316 when the tuning signal at the tuning terminal 356 has a logic value of one. Thus, the overall inductance of the LC VCO 300 is decreased due to the negative mutual inductance between the inductor 344 and the inductor 322.

In the illustrated example of FIG. 3, responsive to a logic value of zero at the tuning terminal 356, the transistor 326 is disabled, the transistor 336 is enabled, the transistor 334 is disabled, and the transistor 342 is enabled. Thus, current in the peripheral core 304 flows from the supply terminal 348 to the ground terminal 350 through the transistor 336, the transistor 338, the LC tank circuit 330, the transistor 340, and the transistor 342 responsive to the differential output signal $V_{OUT}$ from the LC tank circuit 316. As illustrated in FIG. 3, the control terminal of the transistor 314 is coupled to the second terminal of the LC tank circuit 316 and the control terminal of the transistor 338 is coupled to the second terminal of the LC tank circuit 316. Also, as illustrated in FIG. 3, the control terminal of the transistor 318 is coupled to the first terminal of the LC tank circuit 316 and the control terminal of the transistor 340 is coupled to the first terminal of the LC tank circuit 316.

Because the control terminals of the transistor 338 and the transistor 340 are coupled to the LC tank circuit 316 in the same manner as compared to the control terminals of the transistor 314 and the transistor 318, the peripheral core 304 injects current into the LC tank circuit 330 at similar times as when the main core 302 injects current into the LC tank circuit 316. As such, the LC tank circuit 330 generates an oscillating signal, such as current, in-phase with an oscillating signal, such as current, generated by the LC tank circuit 316 when the tuning signal at the tuning terminal 356 has a logic value of zero. Thus, the overall inductance of the LC VCO 300 is increased due to the positive mutual inductance between the inductor 344 and the inductor 322.

As illustrated in FIG. 3, the inductance of the LC VCO 300 can be tuned without utilizing switches in the LC tank circuit 316 or the LC tank circuit 330. Instead, the inductance of the LC VCO 300 is tuned using phase control switches, such as the transistor 326, the transistor 334, the transistor 336, and the transistor 342, outside of the LC tank circuit 316 and the LC tank circuit 330. As such, not only can the capacitance of the LC VCO 300 be tuned, but also the inductance of the LC VCO 300 can be tuned without impacting the quality factor of the LC tank circuit 316 or the LC tank circuit 330. As a result, the operational frequency range of the LC VCO 300 can be increased while reducing the area and power consumption of the LC VCO 300 as compared to other LC VCOs.

In the illustrated example of FIG. 3, the transistor 312, the transistor 314, the transistor 326, the transistor 328, the transistor 336, and the transistor 338 are p-channel MOS-FETs. Alternatively, the transistor 312, the transistor 314, the transistor 326, the transistor 328, the transistor 336, and the transistor 338 may be p-channel FETs, p-channel IGBTs, p-channel JFETs, PNP BJTs, or, with slight modifications, n-type equivalent devices. In the example of FIG. 3, the transistor 318, the transistor 320, the transistor 332, the transistor 334, the transistor 340, and the transistor 342 are n-channel MOSFETs. Alternatively, the transistor 318, the transistor 320, the transistor 332, the transistor 334, the transistor 340, and the transistor 342 may be n-channel FETs, n-channel IGBTs, n-channel JFETs, NPN BJTs, or, with slight modifications, p-type equivalent devices. The transistor 312, the transistor 314, the transistor 318, the transistor 320, the transistor 326, the transistor 328, the transistor 332, the transistor 334, the transistor 336, the transistor 338, the transistor 340, and the transistor 342 may be depletion mode devices, drain-extended devices, enhancement mode devices, natural transistors or other type of device structure transistors. Furthermore, the transistor 312, the transistor 314, the transistor 318, the transistor 320, the transistor 326, the transistor 328, the transistor 332, the transistor 334, the transistor 336, the transistor 338, the transistor 340, and the transistor 342 may be implemented in/over a Si substrate, a SiC substrate, a GaN substrate, or a GaAs substrate.

Figure 4A:
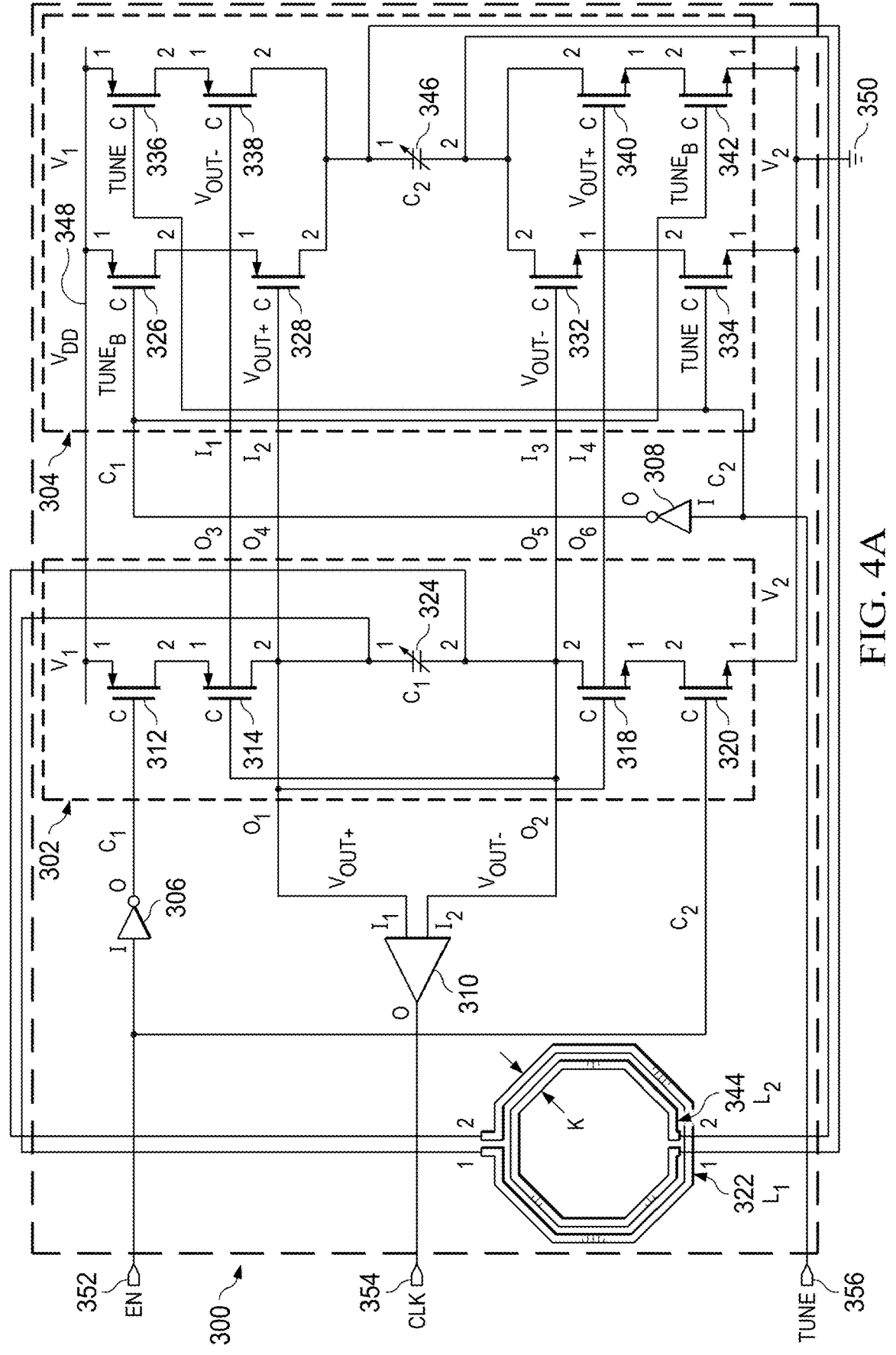
FIG. 4A is a schematic diagram of the LC VCO of FIG. 3 where the second inductor of the peripheral core is physically nested within the first inductor of the main core.

FIG. 4A is a schematic diagram of the LC VCO 300 of FIG. 3 where the inductor 344 of the peripheral core 304 is physically nested within the inductor 322 of the main core 302. In the example of FIG. 4A, the inductor 344 is positioned within the footprint of the inductor 322. For example, the inductor 344 is positioned within the interior area of the inductor 322. In the example of FIG. 4A, the inductor 344 is physically nested within the inductor 322 to satisfy a target coupling coefficient K. By satisfying the target coupling coefficient K, the LC VCO 300 satisfies a target operational frequency range and a target separation between frequency bands within the target operational frequency range.

Also, by physically nesting the inductor 344 within the inductor 322, the LC VCO 300 consumes less area on a chip while achieving a wide operational frequency range as compared to other LC VCOs. For example, by physically nesting the inductor 344 within the inductor 322, the LC VCO 300 consumes about the same amount of area on a chip as a single LC VCO while providing an operational frequency range comparable to that of two LC VCOs including multiplexed outputs. In this manner, examples described herein include a single-stage, multi-band hybrid LC VCO that is tunable responsive to polarity-control phase injection.

Figure 4B:
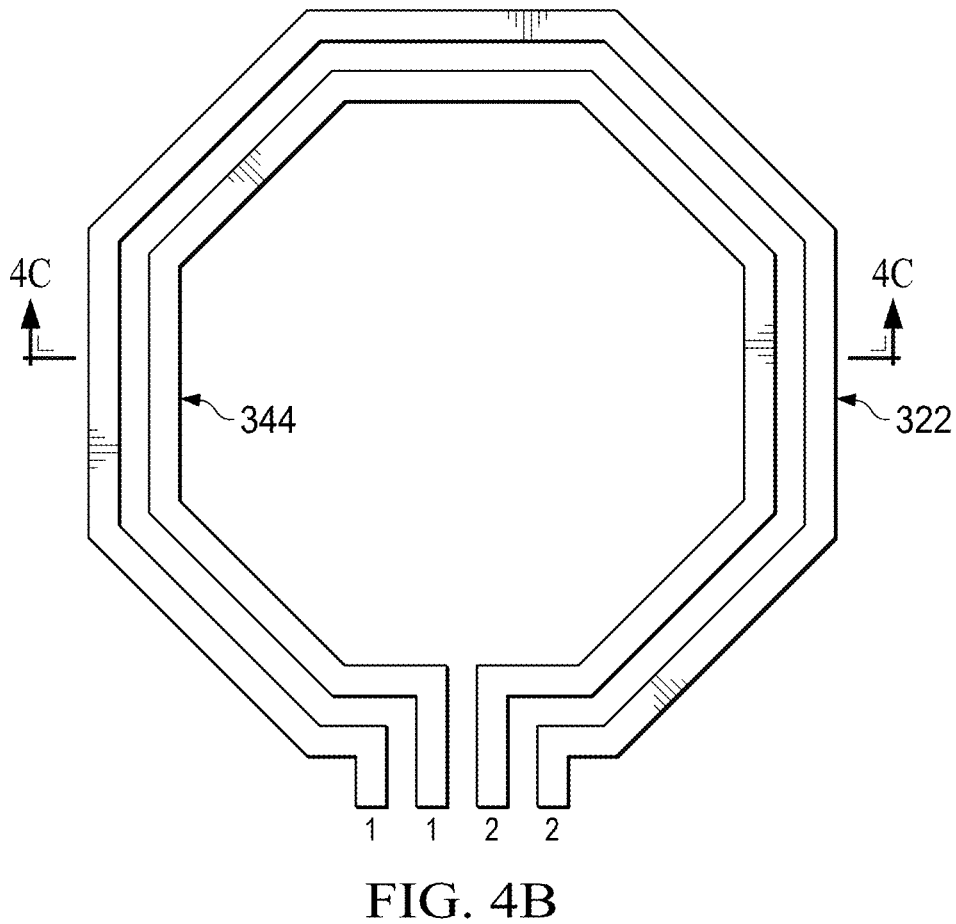
FIG. 4B is a top-down view of the first inductor of the main core and the second inductor of the peripheral core.
Figure 4C:
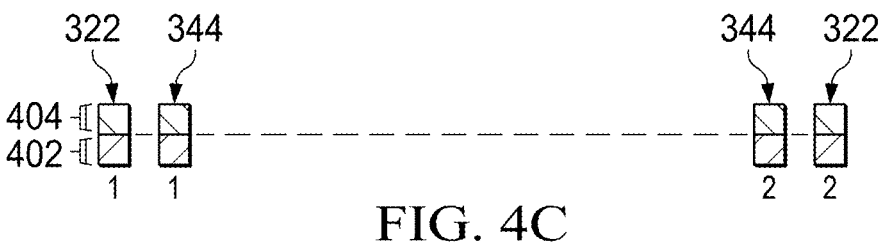
FIG. 4C is a cross-sectional side view of the first inductor of the main core and the second inductor of the peripheral core.

FIG. 4B is a top-down view of the inductor 322 of the main core 302 and the inductor 344 of the peripheral core 304. FIG. 4C is a cross-sectional side view of the inductor 322 of the main core 302 and the inductor 344 of the peripheral core 304. The top-down view of FIG. 4B and the cross-sectional side view of FIG. 4C are representative of how the inductor 322 and the inductor 344 are implemented in a substrate. As illustrated in FIG. 4C, the inductor 322 and the inductor 344 are at least one of resident in, situated in, or disposed in an example metal layer 402 of a substrate. For example, the metal layer 402 may be made of a metal that includes at least one of copper or aluminum. Also, as illustrated in FIG. 4C, the metal layer 402 is below an example capping layer 404. For example, the capping layer 404 may be made of a metal that includes at least one of tungsten, titanium, titanium nitride, cobalt, platinum, gold, nickel, aluminum, copper, or ruthenium.

Figure 5:
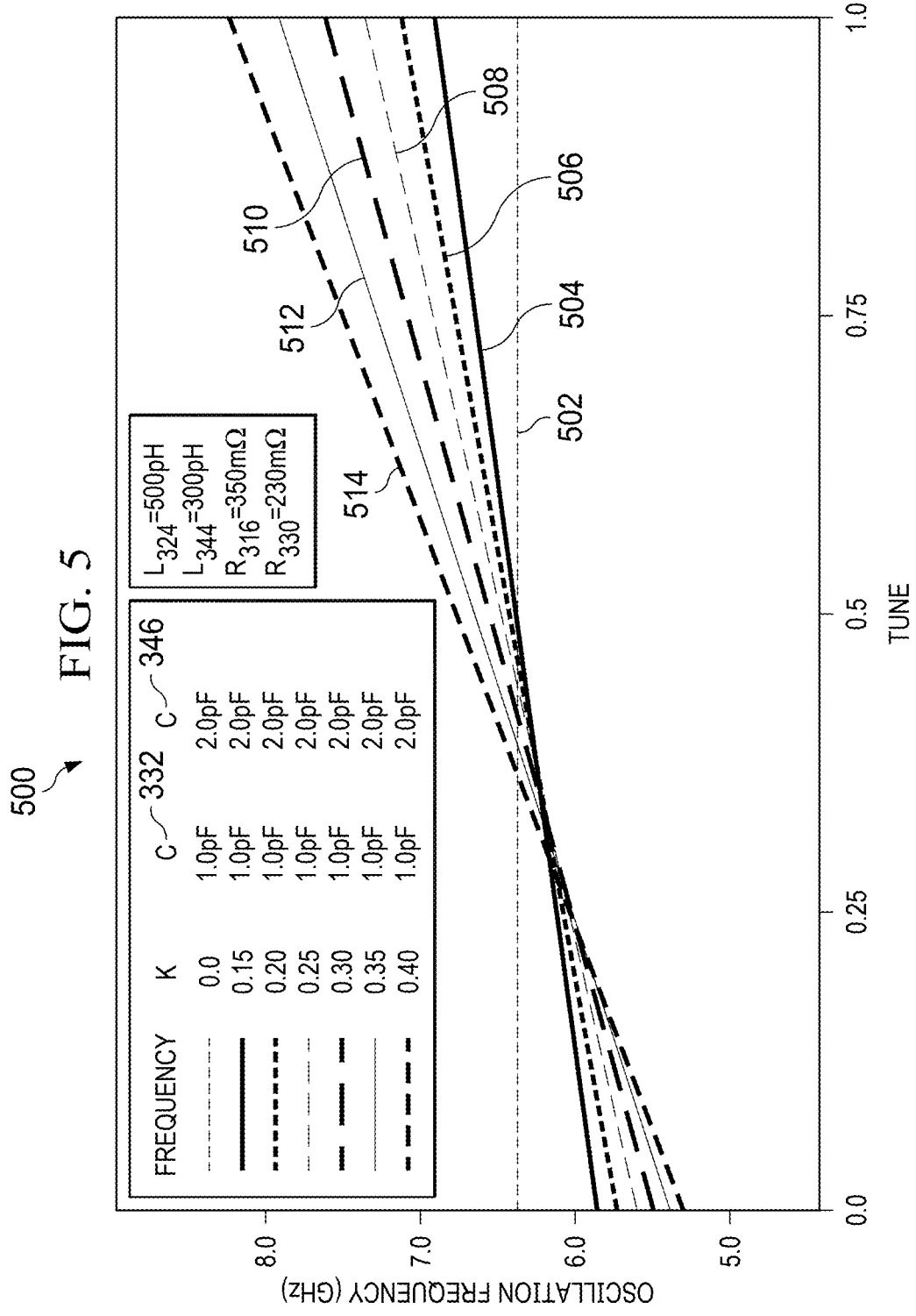
FIG. 5 is a graphical illustration of an example graph depicting change in operating frequency of the LC VCO of FIG. 3 responsive to a value of a tuning signal and a coupling factor K between the first inductor and the second inductor.

FIG. 5 is a graphical illustration of an example graph 500 depicting change in operating frequency of the LC VCO 300 of FIG. 3 responsive to a value of a tuning signal and a coupling factor K between the inductor 322 and the inductor 344. In the example of FIG. 5, the graph 500 depicts oscillation frequency of the differential output voltage signal $V_{OUT}$ in gigahertz (GHz) versus the value of the tuning signal, for example, between zero and one. In the example of FIG. 5, the graph 500 corresponds to the LC VCO 300 of FIG. 3 where the inductor 322 has an inductance of 500 picohenries (pH), the capacitor 324 has a capacitance of one picofarad (pF), the LC tank circuit 316 has a resistance of 350 milliohms (mΩ), the inductor 344 has an inductance of 300 pH, the capacitor 346 has a capacitance of two pF, and the LC tank circuit 330 has a resistance of 230 mΩ.

In the illustrated example of FIG. 5, the graph 500 includes a first example plot 502 corresponding the LC VCO 300 with a coupling factor K of zero, K=0.00, between the inductor 322 and the inductor 344. In the example of FIG. 5, by toggling the tuning signal between zero and one, a user of the LC VCO 300 can toggle the frequency of the clock signal generated by the LC VCO 300 between a lower value and an upper value, respectively. Accordingly, an oscillating signal generated by the LC tank circuit 330 adjusts the frequency of an oscillating signal generated by the LC tank circuit 316 based on the coupling factor K between the inductor 322 and the inductor 344 and the value of the tuning signal at the tuning terminal 356. In the example of the plot 502, the frequency of the clock signal generated by the LC VCO 300 is 6.4 GHz and does not change when the tuning signal is toggled between zero and one because the coupling factor K is zero.

In the illustrated example of FIG. 5, the graph 500 includes a second example plot 504 corresponding the LC VCO 300 with a coupling factor K of 0.15, K=0.15, between the inductor 322 and the inductor 344. In the example of the plot 504, the frequency of the clock signal generated by the LC VCO 300 changes between 5.93 GHZ and 6.97 GHz when the tuning signal is toggled between zero and one, respectively. Accordingly, based on the coupling factor K between the inductor 322 and the inductor 344, an oscillating signal generated by the LC tank circuit 330 increases the frequency of an oscillating signal generated by the LC tank circuit 316 when the value of the tuning signal at the tuning terminal 356 is one. Also, based on the coupling factor K between the inductor 322 and the inductor 344, an oscillating signal generated by the LC tank circuit 330 decreases the frequency of an oscillating signal generated by the LC tank circuit 316 when the value of the tuning signal at the tuning terminal 356 is zero.

In the illustrated example of FIG. 5, the graph 500 includes a third example plot 506 corresponding the LC VCO 300 with a coupling factor K of 0.20, K=0.20, between the inductor 322 and the inductor 344. In the example of the plot 506, the frequency of the clock signal generated by the LC VCO 300 changes between 5.8 GHz and 7.2 GHz when the tuning signal is toggled between zero and one, respectively. In the example of FIG. 5, the graph 500 includes a fourth example plot 508 corresponding the LC VCO 300 with a coupling factor K of 0.25, K=0.25, between inductor 322 and the inductor 344. In the example of the plot 508, the frequency of the clock signal generated by the LC VCO 300 changes between 5.7 GHZ and 7.4 GHz when the tuning signal is toggled between zero and one, respectively.

In the illustrated example of FIG. 5, the graph 500 includes a fifth example plot 510 corresponding the LC VCO 300 with a coupling factor K of 0.30, K=0.30, between inductor 322 and the inductor 344. In the example of the plot 510, the frequency of the clock signal generated by the LC VCO 300 changes between 5.6 GHz and 7.7 GHZ when the tuning signal is toggled between zero and one, respectively. In the example of FIG. 5, the graph 500 includes a sixth example plot 512 corresponding the LC VCO 300 with a coupling factor K of 0.35, K=0.35, between the inductor 322 and the inductor 344. In the example of the plot 512, the frequency of the clock signal generated by the LC VCO 300 changes between 5.47 GHZ and 7.95 GHz when the tuning signal is toggled between zero and one, respectively.

In the illustrated example of FIG. 5, the graph 500 includes a seventh example plot 514 corresponding the LC VCO 300 with a coupling factor K of 0.40, K=0.40, between the inductor 322 and the inductor 344. In the example of the plot 514, the frequency of the clock signal generated by the LC VCO 300 changes between 5.4 GHz and 8.3 GHZ when the tuning signal is toggled between zero and one, respectively. As illustrated in FIG. 5, as the coupling factor K between the inductor 322 and the inductor 344 increases, the tuning range of the LC VCO 300 increases.

In the illustrated example of FIG. 5, by setting the tuning signal to zero, a user can set the frequency of the clock signal generated by the LC VCO 300 to a lower end of the tuning range. Also, by setting the tuning signal to one, a user can set the frequency of the clock signal generated by the LC VCO 300 to a higher end of the tuning range. Once a user sets the frequency of the clock signal generated by the LC VCO 300 via inductance tuning, the user can further tune the frequency of the clock signal by tuning the capacitance of one or more of the capacitor 324 or the capacitor 346.

Figure 6:
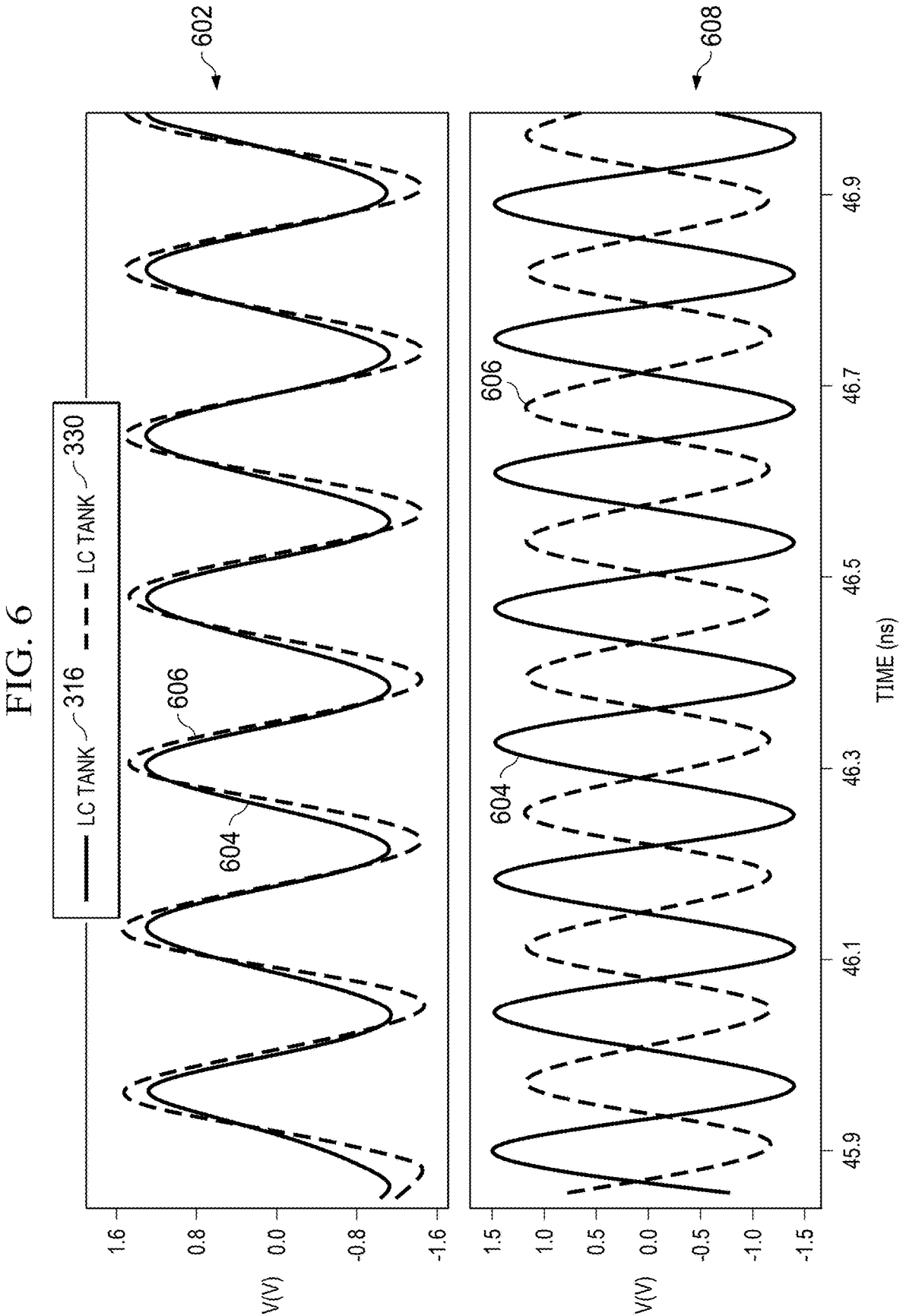
FIG. 6 is a graphical illustration of a first example graph depicting a first example oscillating signal in the LC tank circuit and a second example oscillating signal in the LC tank circuit when the tuning signal has a value of zero and a second example graph depicting the oscillating signal in the LC tank circuit and the oscillating signal in the LC tank circuit when the tuning signal has a value of one.

FIG. 6 is a graphical illustration of a first example graph 602 depicting a first example oscillating signal 604 in the LC tank circuit 316 and a second example oscillating signal 606 in the LC tank circuit 330 when the tuning signal has a value of zero and a second example graph 608 depicting the oscillating signal 604 in the LC tank circuit 316 and the oscillating signal 606 in the LC tank circuit 330 when the tuning signal has a value of one. In the example of FIG. 6, the graph 602 and the graph 608 depict voltage in volts versus time in nanoseconds (ns). As illustrated in FIG. 6, when the value of the tuning signal is zero, the oscillating signal 606 is in-phase with the oscillating signal 604 and when the value of the tuning signal is one, the oscillating signal 606 is out-of-phase with the oscillating signal 604. In other words, when the tuning signal has a value of zero, the LC tank circuit 330 generates an oscillating signal in-phase with the oscillating signal generated by the LC tank circuit 316 and when the tuning signal has a value of one, the LC tank circuit 330 generates an oscillating signal out-of-phase with the oscillating signal generated by the LC tank circuit 316. Also, as illustrated in FIG. 6, when the value of the tuning signal is zero, the frequency of the differential output signal $V_{OUT}$ is 5.76 GHz and when the value of the tuning signal is one, the frequency of the differential output signal $V_{OUT}$ is 7.097 GHZ.

Figure 7A:
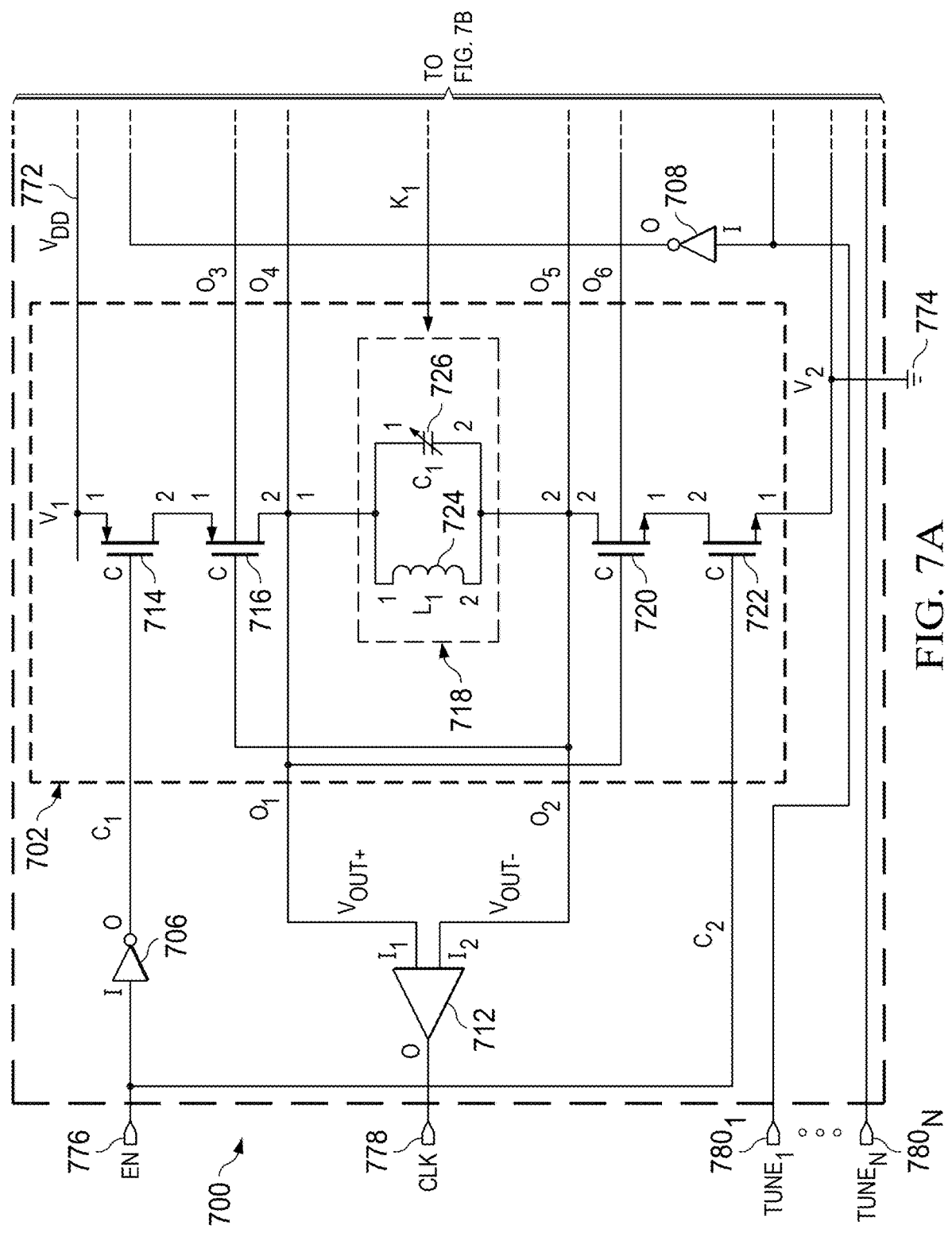
FIGS. 7A and 7B (collectively referred to as FIG. 7) is a schematic diagram of an example LC VCO including an example main core and N example peripheral cores.
Figures 7A, 7B:
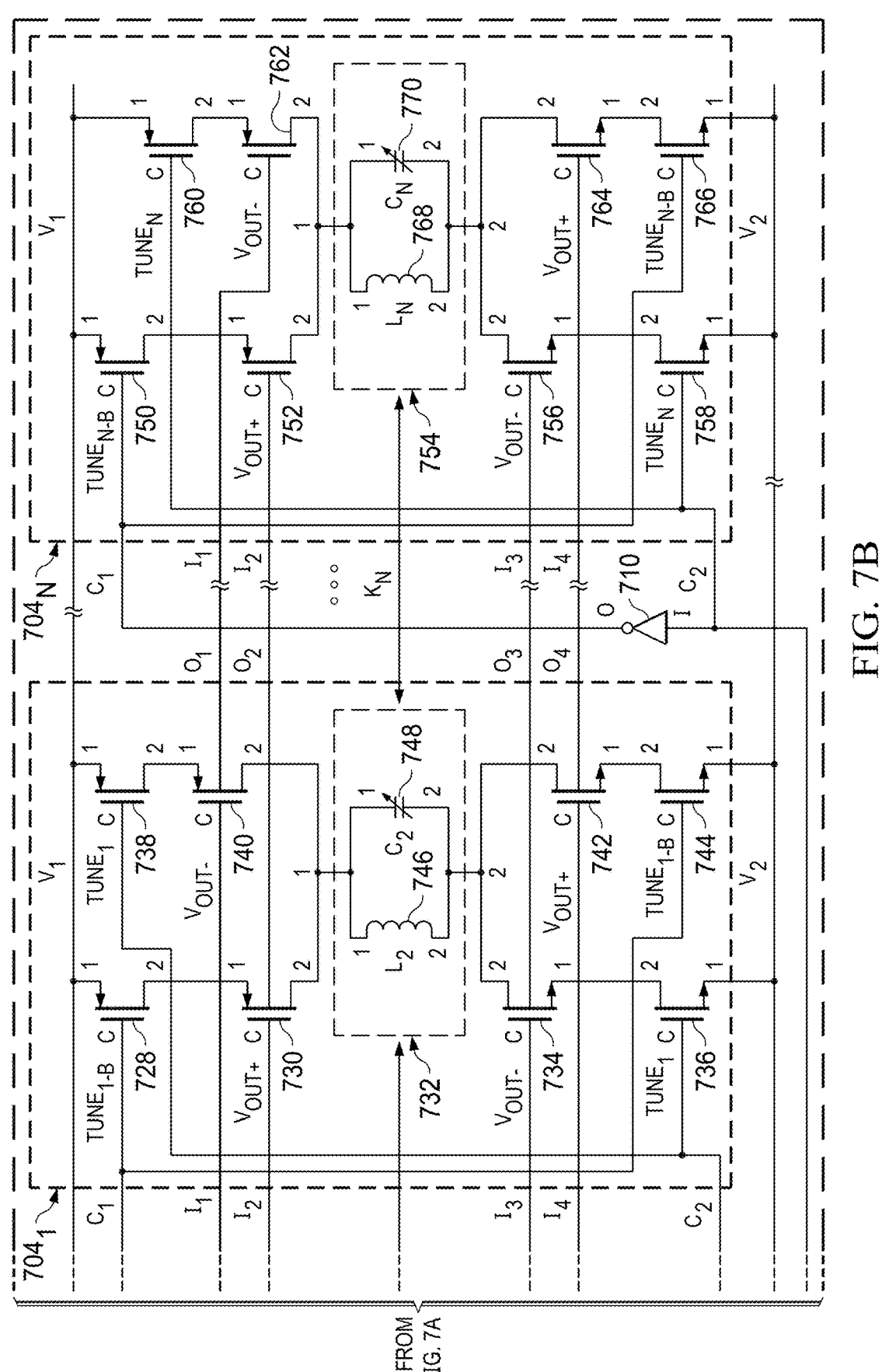

FIG. 7 is a schematic diagram of an example LC VCO 700 including an example main core 702 and N example peripheral cores $704_1$-$704_N$. In the example of FIG. 7, the LC VCO 700 also includes a first example inverter 706, a second example inverter 708, a third example inverter 710, and an example buffer 712. In the example of FIG. 7, the main core 702, also referred to as a first core, includes a first example transistor 714, a second example transistor 716, a first example inductor-capacitor (LC) tank circuit 718, a third example transistor 720, and a fourth example transistor 722. Also, the example LC tank circuit 718 includes a first example inductor 724 and a first example capacitor 726.

In the illustrated example of FIG. 7, the peripheral core $704_1$, also referred to as a second core, includes a fifth example transistor 728, a sixth example transistor 730, a second example LC tank circuit 732, a seventh example transistor 734, an eighth example transistor 736, a ninth example transistor 738, a tenth example transistor 740, an eleventh example transistor 742, and a twelfth example transistor 744. In the example of FIG. 7, the example LC tank circuit 732 includes a second example inductor 746 and a second example capacitor 748. Also, the peripheral core $704_N$, also referred to as an N+1th core, includes a thirteenth example transistor 750, a fourteenth example transistor 752, a third example LC tank circuit 754, a fifteenth example transistor 756, a sixteenth example transistor 758, a seventeenth example transistor 760, an eighteenth example transistor 762, a nineteenth example transistor 764, and a twentieth example transistor 766. In the example of FIG. 7, the example LC tank circuit 754 includes a third example inductor 768 and a third example capacitor 770.

In the illustrated example of FIG. 7, the LC VCO 700 includes an example supply terminal 772, an example ground terminal 774, an example enable terminal 776, an example clock terminal 778, and N example tuning terminals $780_1$-$780_N$. In some examples, the supply terminal 772 is referred to as at least one of $V_{DD}$ or a voltage terminal and the ground terminal 774 is referred to as at least one of GND or a voltage terminal. In the example of FIG. 7, the main core 702 has a first voltage terminal, a second voltage terminal, a first control terminal, a second control terminal, a first output, a second output, a third output, a fourth output, a fifth output, and a sixth output. In the example of FIG. 7, the peripheral core $704_1$ has a first voltage terminal, a second voltage terminal, a first control terminal, a second control terminal, a first input, a second input, a third input, a fourth input, a first output, a second output, a third output, and a fourth output. Also, the peripheral core $704_N$ has a first voltage terminal, a second voltage terminal, a first control terminal, a second control terminal, a first input, a second input, a third input, and a fourth input.

In the illustrated example of FIG. 7, each of the inverter 706, the inverter 708, and the inverter 710 has an input and an output. In the example of FIG. 7, each of the transistor 714, the transistor 716, the transistor 720, the transistor 722, the transistor 728, the transistor 730, the transistor 734, the transistor 736, the transistor 738, the transistor 740, the transistor 742, and the transistor 744, the transistor 750, the transistor 752, the transistor 756, the transistor 758, the transistor 760, the transistor 762, the transistor 764, and the transistor 766 has a control terminal, a first terminal, and a second terminal. In some example, the control terminal, the first terminal, and the second terminal of a transistor are referred to as a gate terminal, a source terminal, and a drain terminal of the transistor, respectively. Also, each of the LC tank circuit 718, the inductor 724, the capacitor 726, the LC tank circuit 732, the inductor 746, the capacitor 748, the LC tank circuit 754, the inductor 768, and the capacitor 770 has a first terminal and a second terminal. In the example of FIG. 7, the buffer 712 has a first input, a second input, and an output.

In the illustrated example of FIG. 7, the first terminal of the transistor 714 operates as the first voltage terminal of the main core 702 and the first terminal of the transistor 722 operates as the second voltage terminal of the main core 702. Also, the control terminal of the transistor 714 operates as the first control terminal of the main core 702 and the control terminal of the transistor 722 operates as the second control terminal of the main core 702. In the example of FIG. 7, the first terminal of the LC tank circuit 718 operates as the first output, the fourth output, and the sixth output of the main core 702 and the second terminal of the LC tank circuit 718 operates as the second output, the third output, and the fifth output of the main core 702.

In the illustrated example of FIG. 7, the first terminal of the transistor 728 and the first terminal of the transistor 738 operate as the first voltage terminal of the peripheral core $704_1$. In the example of FIG. 7, the first terminal of the transistor 736 and the first terminal of the transistor 744 operate as the second voltage terminal of the peripheral core $704_1$. Also, the control terminal of the transistor 728 and the control terminal of the transistor 744 operate as the first control terminal of the peripheral core $704_1$. In the example of FIG. 7, the control terminal of the transistor 736 and the control terminal of the transistor 738 operate as the second control terminal of the peripheral core $704_1$.

In the illustrated example of FIG. 7, the control terminal of the transistor 740 operates as the first input and the first output of the peripheral core $704_1$. In the example of FIG. 7, the control terminal of the transistor 730 operates as the second input and the second output of the peripheral core $704_1$. Also, the control terminal of the transistor 734 operates as the third input and the third output of the peripheral core $704_1$. In the example of FIG. 7, the control terminal of the transistor 742 operates as the fourth input and the fourth output of the peripheral core $704_1$.

In the illustrated example of FIG. 7, the first terminal of the transistor 750 and the first terminal of the transistor 760 operate as the first voltage terminal of the peripheral core $704_N$. In the example of FIG. 7, the first terminal of the transistor 758 and the first terminal of the transistor 766 operate as the second voltage terminal of the peripheral core $704_N$. Also, the control terminal of the transistor 750 and the control terminal of the transistor 766 operate as the first control terminal of the peripheral core $704_N$. In the example of FIG. 7, the control terminal of the transistor 758 and the control terminal of the transistor 760 operate as the second control terminal of the peripheral core $704_N$.

In the illustrated example of FIG. 7, the control terminal of the transistor 762 operates as the first input of the peripheral core $704_N$. In the example of FIG. 7, the control terminal of the transistor 752 operates as the second input of the peripheral core $704_N$. Also, the control terminal of the transistor 756 operates as the third input of the peripheral core $704_N$. In the example of FIG. 7, the control terminal of the transistor 764 operates as the fourth input of the peripheral core $704_N$.

In the illustrated example of FIG. 7, the first voltage terminal of the main core 702, the first voltage terminal of the peripheral core $704_1$, and the first voltage terminal of the peripheral core $704_N$ are coupled to the supply terminal 772. In the example of FIG. 7, the second voltage terminal of the main core 702, the second voltage terminal of the peripheral core $704_1$, and the second voltage terminal of the peripheral core $704_N$ are coupled to the ground terminal 774. Also, the first control terminal of the main core 702 is coupled to the output of the inverter 706 and the second control terminal of the main core 702 is coupled to the enable terminal 776.

In the illustrated example of FIG. 7, the first control terminal of the peripheral core $704_1$ is coupled to the output of the inverter 708 and the second control terminal of the peripheral core $704_1$ is coupled to the tuning terminal $780_1$. In the example of FIG. 7, the first output of the main core 702 is coupled to the first input of the buffer 712 and the second output of the main core 702 is coupled to the second input of the buffer 712. Also, the third output of the main core 702 is coupled to the first input of the peripheral core $704_1$, the fourth output of the main core 702 is coupled to the second input of the peripheral core $704_1$, the fifth output of the main core 702 is coupled to the third input of the peripheral core $704_1$, and the sixth output of the main core 702 is coupled to the fourth input of the peripheral core $704_1$.

In the illustrated example of FIG. 7, the first control terminal of the peripheral core $704_N$ is coupled to the output of the inverter 710 and the second control terminal of the peripheral core $704_N$ is coupled to the tuning terminal $780_N$. In the example of FIG. 7, the first output of the peripheral core $704_1$ is coupled to the first input of the peripheral core $704_N$ and the second output of the peripheral core $704_1$ is coupled to the second input of the peripheral core $704_N$. Also, the third output of the peripheral core $704_1$ is coupled to the third input of the peripheral core $704_N$ and the fourth output of the peripheral core $704_1$ is coupled to the fourth input of the peripheral core $704_1$.

In the illustrated example of FIG. 7, the inverter 706, the inverter 708, the buffer 712, the transistor 714, the transistor 716, the LC tank circuit 718 including the inductor 724 and the capacitor 726, the transistor 720, the transistor 722, the transistor 728, the transistor 730, the LC tank circuit 732 including the inductor 746 and the capacitor 748, the transistor 734, the transistor 736, the transistor 738, the transistor 740, the transistor 742, the transistor 744, the supply terminal 772, the ground terminal 774, the enable terminal 776, the clock terminal 778, and the tuning terminal $780_1$ are implemented and coupled in a similar manner as the components of the LC VCO 300 of FIG. 3 unless specified otherwise. In the example of FIG. 7, the inverter 710 is implemented by at least one of analog or digital circuitry. In the example of FIG. 7, the input of the inverter 710 is coupled to the tuning terminal $780_N$ and the output of the inverter 710 is coupled to the control terminal of the transistor 750 and the control terminal of the transistor 766.

In the illustrated example of FIG. 7, the transistor 750 is implemented by a PMOS transistor. In the example of FIG. 7, the control terminal of the transistor 750 is coupled to the output of the inverter 710, the first terminal of the transistor 750 is coupled to the supply terminal 772, and the second terminal of the transistor 750 is coupled to the first terminal of the transistor 752. Also, in the example of FIG. 7, the transistor 752 is implemented by a PMOS transistor. In the example of FIG. 7, the control terminal of the transistor 752 is coupled to the control terminal of the transistor 730 which is coupled to the first terminal of the LC tank circuit 718, the first terminal of the transistor 752 is coupled to the second terminal of the transistor 750, and the second terminal of the transistor 752 is coupled to the first terminal of the LC tank circuit 754.

In the illustrated example of FIG. 7, the transistor 760 is implemented by a PMOS transistor. In the example of FIG. 7, the control terminal of the transistor 760 is coupled to the tuning terminal 780$_N$, the first terminal of the transistor 760 is coupled to the supply terminal 772, and the second terminal of the transistor 760 is coupled to the first terminal of the transistor 762. Also, in the example of FIG. 7, the transistor 762 is implemented by a PMOS transistor. In the example of FIG. 7, the control terminal of the transistor 762 is coupled to the control terminal of the transistor 740 which is coupled to the second terminal of the LC tank circuit 718, the first terminal of the transistor 762 is coupled to the second terminal of the transistor 760, and the second terminal of the transistor 762 is coupled to the first terminal of the LC tank circuit 754.

In the illustrated example of FIG. 7, the first terminal of the LC tank circuit 754 is implemented by the first terminal of the inductor 768 and the first terminal of the capacitor 770. Also, the second terminal of the LC tank circuit 754 is implemented by the second terminal of the inductor 768 and the second terminal of the capacitor 770. In the example of FIG. 7, the first terminal of the LC tank circuit 754 is coupled to the second terminal of the transistor 752 and the second terminal of the transistor 762. Also, the second terminal of the LC tank circuit 754 is coupled to the second terminal of the transistor 756 and the second terminal of the transistor 764.

In the illustrated example of FIG. 7, the first terminal of the inductor 768 is coupled to the second terminal of the transistor 752, the second terminal of the transistor 762, and the first terminal of the capacitor 770. Also, the second terminal of the inductor 768 is coupled to the second terminal of the transistor 756, the second terminal of the transistor 764, and the second terminal of the capacitor 770. In the example of FIG. 7, the capacitor 770 is a tunable capacitor. To tune the capacitance of the capacitor 770, two or more capacitors are coupled in parallel to the implement the capacitor 770 and a switch is placed in series with each of the two or more capacitors.

As such, one or more of the switches can be toggled on or off to increase or decrease the capacitance of the capacitor 770. In the example of FIG. 7, the first terminal of the capacitor 770 is coupled to the second terminal of the transistor 752, the second terminal of the transistor 762, and the first terminal of the inductor 768. Also, the second terminal of the capacitor 770 is coupled to the second terminal of the transistor 756, the second terminal of the transistor 764, and the second terminal of the inductor 768.

In the illustrated example of FIG. 7, the transistor 756 is implemented by an NMOS transistor. In the example of FIG. 7, the control terminal of the transistor 756 is coupled to the control terminal of the transistor 734 which is coupled to the second terminal of the LC tank circuit 718, the first terminal of the transistor 756 is coupled to the second terminal of the transistor 758, and the second terminal of the transistor 756 is coupled to the second terminal of the LC tank circuit 754. Also, in the example of FIG. 7, the transistor 758 is implemented by an NMOS transistor. In the example of FIG. 7, the control terminal of the transistor 758 is coupled to the tuning terminal 780$_N$, the first terminal of the transistor 758 is coupled to the ground terminal 774, and the second terminal of the transistor 758 is coupled to the first terminal of the transistor 756.

In the illustrated example of FIG. 7, the transistor 764 is implemented by an NMOS transistor. In the example of FIG. 7, the control terminal of the transistor 764 is coupled to the control terminal of the transistor 742 which is coupled to the first terminal of the LC tank circuit 718, the first terminal of the transistor 764 is coupled to the second terminal of the transistor 766, and the second terminal of the transistor 764 is coupled to the second terminal of the LC tank circuit 754. Also, in the example of FIG. 7, the transistor 766 is implemented by an NMOS transistor. In the example of FIG. 7, the control terminal of the transistor 766 is coupled to the output of the inverter 710, the first terminal of the transistor 766 is coupled to the ground terminal 774, and the second terminal of the transistor 766 is coupled to the first terminal of the transistor 764.

In example operation, the LC VCO 700 operates responsive to an enable signal at the enable terminal 776 and N tuning signals at the tuning terminals 780$_1$-780$_N$. For example, the LC VCO 700 operates similarly to the LC VCO 300 of FIG. 3, but with N peripheral cores 704$_1$-704$_N$ where the inductors of each peripheral core have respective coupling factors K$_1$-K$_N$ with the preceding core. As such, by toggling the tuning signals at the tuning terminals 780$_1$-780$_N$, the inductance of the LC VCO 700 can be tuned without utilizing switches in the LC tank circuit 718, the LC tank circuit 732, or the LC tank circuit 754.

In the illustrated example of FIG. 7, the transistor 714, the transistor 716, the transistor 728, the transistor 730, the transistor 738, the transistor 740, the transistor 750, the transistor 752, the transistor 760, and the transistor 762 are p-channel MOSFETs. Alternatively, the transistor 714, the transistor 716, the transistor 728, the transistor 730, the transistor 738, the transistor 740, the transistor 750, the transistor 752, the transistor 760, and the transistor 762 may be p-channel FETs, p-channel IGBTs, p-channel JFETs, PNP BJTs, or, with slight modifications, n-type equivalent devices. In the example of FIG. 7, the transistor 720, the transistor 722, the transistor 734, the transistor 736, the transistor 742, the transistor 744, the transistor 756, the transistor 758, the transistor 764, and the transistor 766 are n-channel MOSFETs. Alternatively, the transistor 720, the transistor 722, the transistor 734, the transistor 736, the transistor 742, the transistor 744, the transistor 756, the transistor 758, the transistor 764, and the transistor 766 may be n-channel FETs, n-channel IGBTs, n-channel JFETs, NPN BJTs, or, with slight modifications, p-type equivalent devices. The transistor 714, the transistor 716, the transistor 720, the transistor 722, the transistor 728, the transistor 730, the transistor 734, the transistor 736, the transistor 738, the transistor 740, the transistor 742, the transistor 744, the transistor 750, the transistor 752, the transistor 756, the transistor 758, the transistor 760, the transistor 762, the transistor 764, and the transistor 766 may be depletion mode devices, drain-extended devices, enhancement mode devices, natural transistors or other type of device structure transistors. Furthermore, the transistor 714, the transistor 716, the transistor 720, the transistor 722, the transistor 728, the transistor 730, the transistor 734, the transistor 736, the transistor 738, the transistor 740, the transistor 742, the transistor 744, the transistor 750, the transistor 752, the transistor 756, the transistor 758, the transistor 760, the transistor 762, the transistor 764, and the transistor 766 may be implemented in/over a Si substrate, a SiC substrate, a GaN substrate, or a GaAs substrate.

Figure 8A:
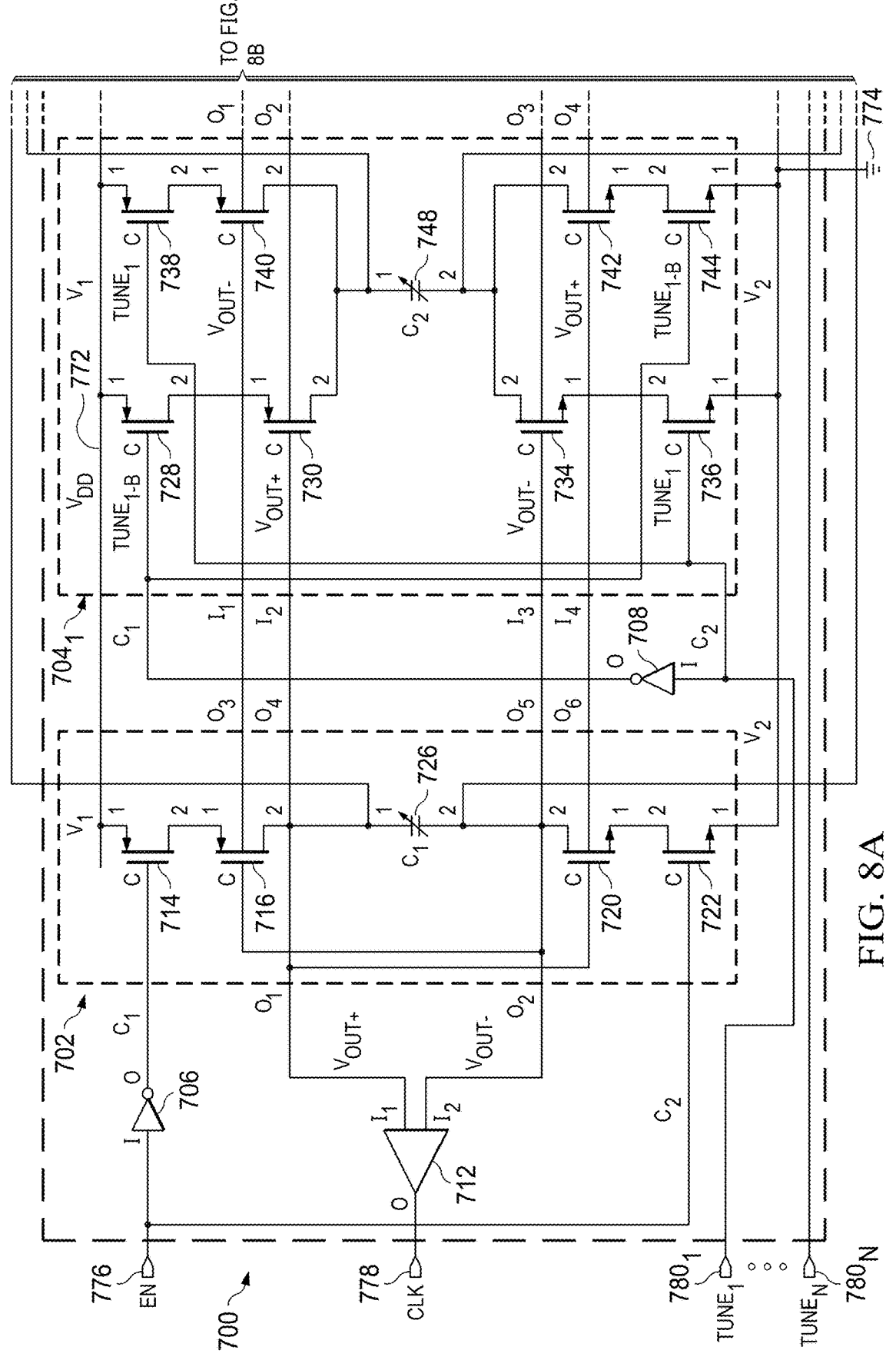
FIGS. 8A and 8B (collectively referred to as FIG. 8) is a schematic diagram of the LC VCO of FIG. 7 where the number of peripheral cores is two and the third inductor of the peripheral core is physically nested within the second inductor of the peripheral core which is physically nested within the first inductor of the main core.
Figure 8B:
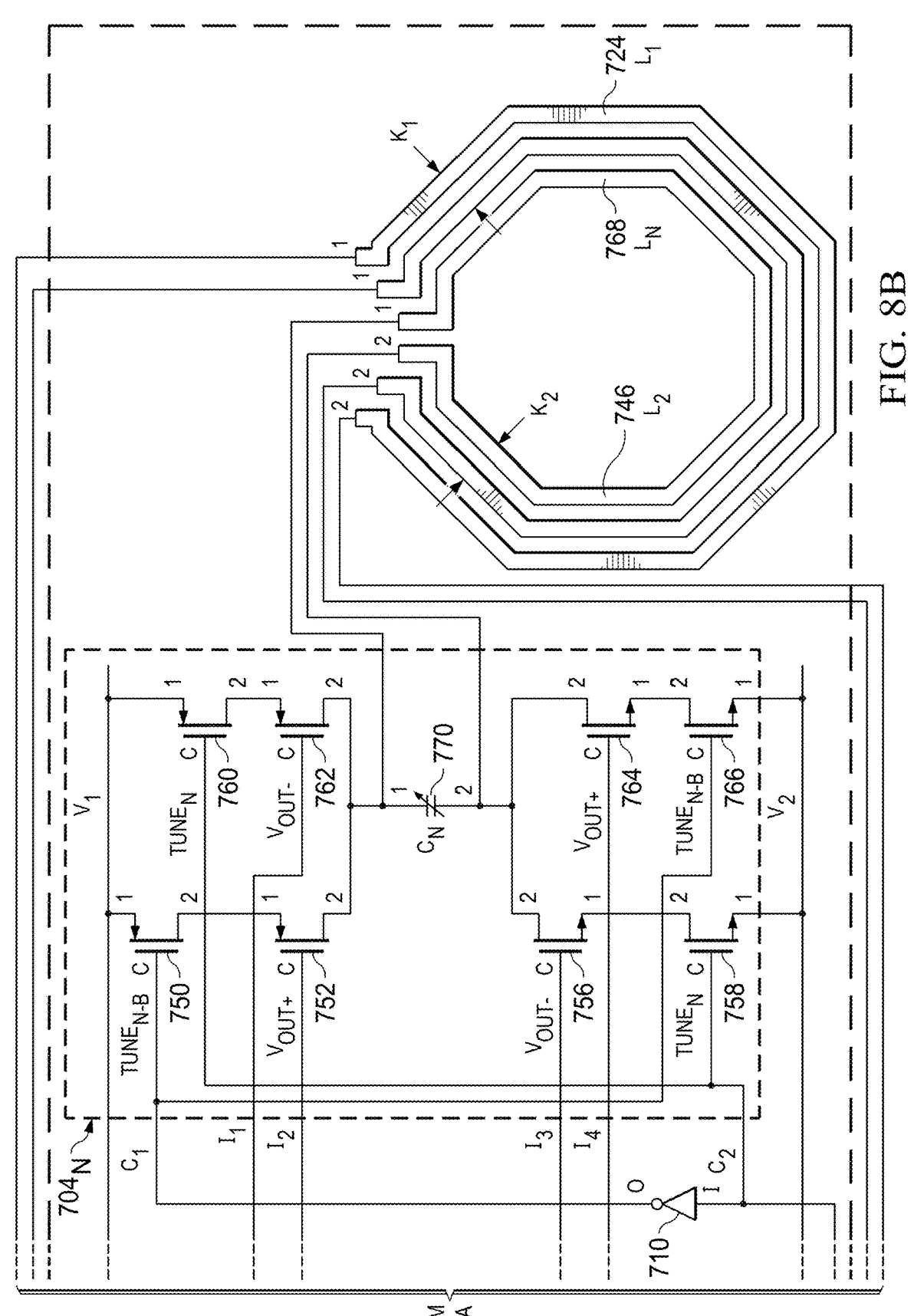

FIG. 8 is a schematic diagram of the LC VCO 700 of FIG. 7 where the number of peripheral cores is two and the inductor 768 of the peripheral core 704$_N$ is physically nested within the inductor 746 of the peripheral core 704$_1$ which is physically nested within the inductor 724 of the main core 702. In the example of FIG. 8, each of the inductor 768, the inductor 746, and the inductor 724 is implemented by a high, multi-layer inductor, for example, three or more layers. Other inductor constructions may be used to implement one or more of the inductor 768, the inductor 746, or the inductor 724. For example, one or more of the inductor 768, the inductor 746, or the inductor 724 may be implemented by a multi-turn inductor.

In the illustrated example of FIG. 8, the inductor 768 is physically nested within the inductor 746 which is physically nested within the inductor 724 to satisfy target coupling coefficients K$_1$ and K$_2$. By satisfying the target coupling coefficients K$_1$ and K$_2$, the LC VCO 700 satisfies a target operational frequency range and a target separation between frequency bands within the target operational frequency range. Also, by physically nesting the inductor 768 within the inductor 746 and the inductor 746 within the inductor 724, the LC VCO 700 consumes less area on a chip while achieving a wide operational frequency range as compared to other LC VCOs. For example, by physically nesting the inductor 768 within the inductor 746 and the inductor 746 within the inductor 724, the LC VCO 700 consumes about the same amount of area on a chip as a single LC VCO while providing an operational frequency range comparable to that of three LC VCOs including multiplexed outputs. In this manner, examples described herein include a single-stage, multi-band hybrid LC VCO that is tunable responsive to polarity-control phase injection.

Figure 9:
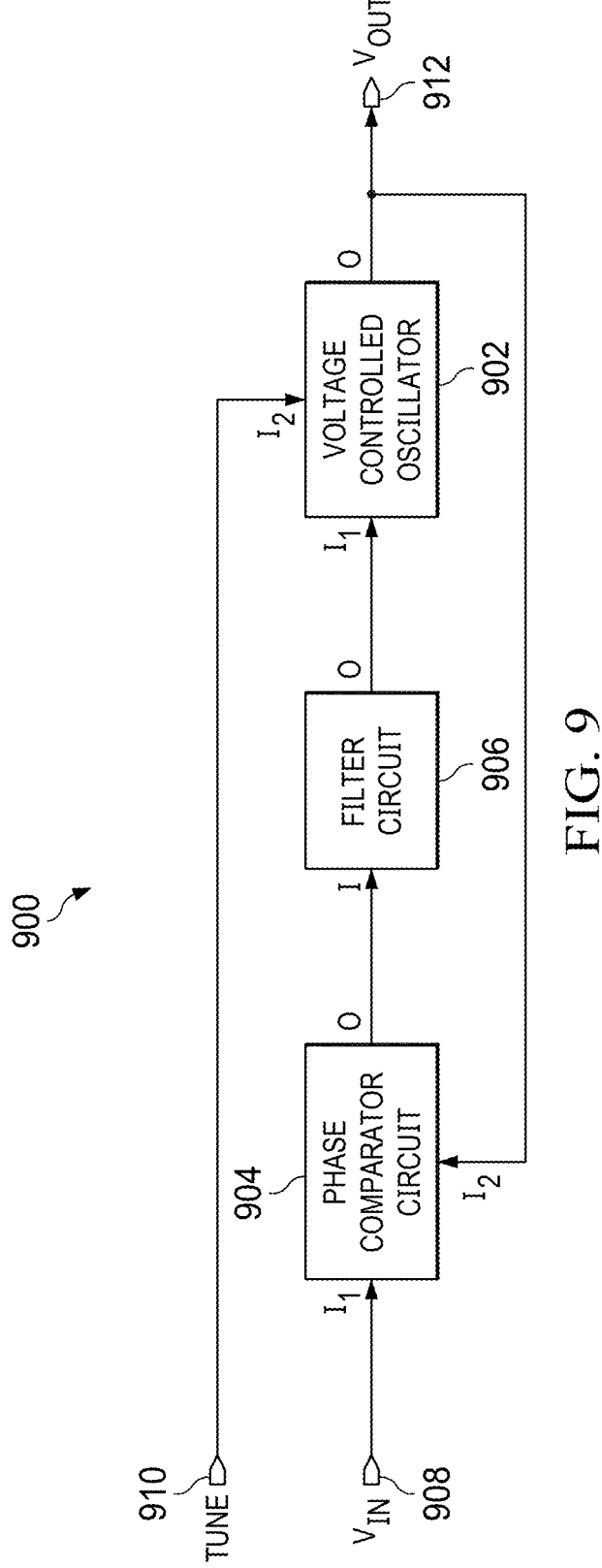
FIG. 9 is a block diagram of an example phase-locked loop (PLL) oscillator including an example VCO implemented in conjunction with examples described herein.

FIG. 9 is a block diagram of an example phase-locked loop (PLL) oscillator 900 including an example VCO 902 implemented in conjunction with examples described herein. In the example of FIG. 9, the PLL oscillator 900 includes an example phase comparator circuit 904, an example filter circuit 906, an example input 908, an example tuning terminal 910, and an example output 912. Also, each of the VCO 902 and the phase comparator circuit 904 has a first input, a second input, and an output. In some examples, the VCO 902 has additional inputs. In the example of FIG. 9, the filter circuit 906 has an input and an output.

In the illustrated example of FIG. 9, the VCO 902 is implemented in conjunction with the LC VCO 100 of FIG. 1, the LC VCO 300 of FIGS. 3 and 4A, or the LC VCO 700 of FIGS. 7 and 8. In the example of FIG. 9, the first input of the VCO 902 is coupled to the output of the filter circuit 906 and the second input of the VCO 902 is coupled to the tuning terminal 910. In some examples, the VCO 902 has additional inputs coupled to additional tuning terminals. Also, the output of the VCO 902 is coupled to the second input of the phase comparator circuit 904 and the output 912.

In the illustrated example of FIG. 9, the phase comparator circuit 904 is implemented by at least one of analog or digital circuitry. In the example of FIG. 9, the first input of the phase comparator circuitry 904 is coupled to the input 908, the second input of the phase comparator circuit 904 is coupled to the output of the VCO 902, and the output of the phase comparator circuit 904 is coupled to the input of the filter circuit 906. Also, in the example of FIG. 9, the filter circuit 906 is implemented by at least one of analog or digital circuitry. In the example of FIG. 9, the input of the filter circuit 906 is coupled to the output of the phase comparator circuit 904 and the output of the filter circuit 906 is coupled to the first input of the VCO 902.

In the illustrated example of FIG. 9, the VCO 902 generates a periodic signal, also referred to as V$_{OUT}$, with a frequency proportional to an applied voltage at the first input. In the example of FIG. 9, the phase comparator circuit 904 compares the phase of the signal provided by the VCO 902 with the phase of a periodic input reference signal, also referred to as VIN, at the input 908. Based on the comparison, the phase comparator circuit 904 provides a voltage (that is filtered by the filter circuit 906) to adjust the frequency of the VCO 902 to match the phase of the signal at the output 912 to the phase of the signal at the input 908. In some examples, a user can adjust an operational frequency range of the VCO 902 via a tuning signal applied at the tuning terminal 910 as described herein.

Figure 10:
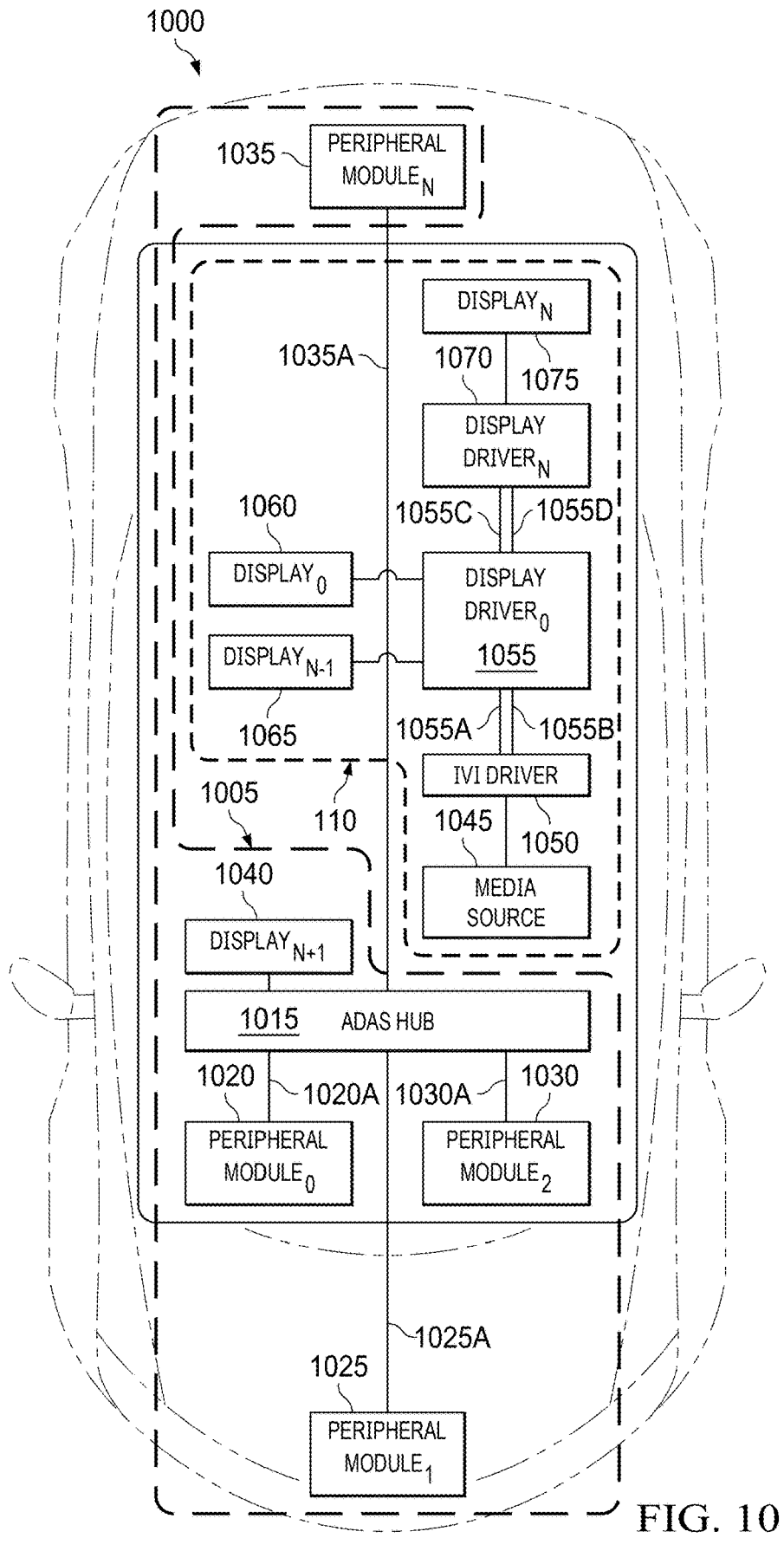
FIG. 10 is a block diagram of an example vehicle including an example advanced driver-assistance (ADAS) system and an example in-vehicle infotainment (IVI) system.

FIG. 10 is a block diagram of an example vehicle 1000 including an example advanced driver-assistance (ADAS) system 1005 and an example in-vehicle infotainment (IVI) system 1010. The example ADAS system 1005 of FIG. 10 includes an example ADAS hub 1015, a first example peripheral module 1020, a second example peripheral module 1025, a third example peripheral module 1030, a fourth example peripheral module 1035, and an example display 1040. The example IVI system 1010 of FIG. 10 includes an example media source 1045, example IVI driver circuitry 1050, a first example display driver 1055, a first example display 1060, a second example display 1065, a second example display driver 1070, and a third example display 1075.

The vehicle 1000 illustrates example implementations of flat panel display (FPD) link systems for displaying media, such as images, multi-media content, etc. Example FPD link systems include the ADAS system 1005 and the IVI system 1010. The example vehicle 1000 of FIG. 10 includes the ADAS system 1005 and the IVI system 1010. In some examples, the vehicle 1000 may include one or more instances of the ADAS system 1005 or the IVI system 1010. For example, the vehicle 1000 may include one or more instances of the ADAS system 1005 without the IVI system 1010. In another example, the vehicle 1000 may include one or more instances of the IVI system 1010 without the ADAS system 1005. In yet another example, the vehicle 1000 may include one or more instances of the ADAS system 1005 and one or more instances of the IVI system 1010. In the example of FIG. 10, the vehicle 1000 is illustrated as a system for traversing distances, such as a car, a truck, etc. Alternatively, the vehicle 1000 may be replaced, illustrated, or described as an alternative distributed display system, such as a boat, airplane, spacecraft, workstation, control panel, etc.

The ADAS system 1005 is an example type of FPD-link system that utilizes serializing and deserializing media for driving assistance in the vehicle 1000. The ADAS system 1005 may utilize serializing and deserializing media for an alternative implementation of processing, storing, or displaying data, such as a security system, recording system, etc. In some examples, the ADAS system 1005 is an example camera system, which facilitates at least one of the storing, processing, or displaying multi-media data, such as images, videos, etc., from one or more cameras. In other examples, the ADAS system 1005 may facilitate at least one of the storing, processing, or displaying an alternative type of data from one or more alternative types of sensors, such as lidar, radar, ultrasonic, etc. sensors. In the example of FIG. 10, the ADAS system 1005 includes the ADAS hub 1015, the peripheral modules 1020, 1025, 1030, 1035, and the display 1040. Alternatively, the ADAS system 1005 may include any number of peripheral module(s) or display(s). An example of the ADAS system 1005 is further illustrated and described in connection with FIG. 11.

The IVI system 1010 is an example type of FPD-link system that utilizes serializing and deserializing media for infotainment on one or more displays, such as the displays 1060, 1065, 1075. In some examples, the IVI system 1010 is a dashboard having multiple displays for displaying content. In other examples, the IVI system 1010 is a different display system having multiple displays for displaying content, such as a studio, workstation, etc. In the example of FIG. 10, the IVI system 1010 includes the media source 1045, the IVI driver circuitry 1050, the display drivers 1055, 1070, and the displays 1060, 1065, 1075. Alternatively, the IVI system 1010 may include any number of media source (s), display driver(s), or display(s). An example of the IVI system 1010 is further illustrated and described in connection with FIG. 12.

The ADAS hub 1015 is communicatively coupled to the peripheral modules 1020, 1025, 1030, 1035 and the display 1040. The ADAS hub 1015 uses full duplex communications to transmit data to and receive data from the peripheral modules 1020, 1025, 1030, 1035. In some examples, the ADAS hub 1015 uses low-voltage differential signaling (LVDS) to communicate with the peripheral modules 1020, 1025, 1030, 1035. Alternatively, the ADAS hub 1015 may use an alternative type of signaling to communicate with the peripheral modules 1020, 1025, 1030, 1035, such as display serial interface (DSI), embedded display port (cDP), etc. The ADAS hub 1015 may at least one of store, process, or display data from the peripheral modules 1020, 1025, 1030, 1035. In the example of FIG. 10, the ADAS hub 1015 displays the data from one or more of the peripheral modules 1020, 1025, 1030, 1035 using the display 1040. The ADAS hub 1015 uses multi-lane signaling to display data using the display 1040. Also, the ADAS hub 1015 may also at least one of store or process data from the peripheral modules 1020, 1025, 1030, 1035 for other functions of the vehicle 1000, such as object recognition, time of flight calculations, etc. An example of the ADAS hub 1015 is further illustrated and described in connection with FIG. 11.

The peripheral modules 1020, 1025, 1030, 1035 are communicatively coupled to the ADAS hub 1015. The peripheral modules 1020, 1025, 1030, 1035 include at least one sensor that obtains information of the surrounding environment, such as images, videos, time of flight measurements, beamforming data, etc. The peripheral modules 1020, 1025, 1030, 1035 transmit the obtained sensor data to the ADAS hub 1015 using communication channels 1020A, 1025A, 1030A, 1035A. In some examples, the communication channels 1020A, 1025A, 1030A, 1035A are coaxial connectors, which couple the ADAS hub 1015 to the peripheral modules 1020, 1025, 1030, 1035. In such examples, the ADAS hub 1015 supplies power to the peripheral modules 1020, 1025, 1030, 1035 using power over coax (POC) across the communication channels 1020A, 1025A, 1030A, 1035A. Alternatively, the communication channels 1020A, 1025A, 1030A, 1035A may be formed by a different type of connector, such as a standard twisted pair (STP). An example of the peripheral modules 1020, 1025, 1030, 1035 are further illustrated and described in connection with FIG. 11.

In example operation of the ADAS system 1005 of FIG. 10, the peripheral modules 1020, 1025, 1030, 1035 produce video streams of the environment surrounding the vehicle 1000. The peripheral modules 1020, 1025, 1030, 1035 serialize data of the video streams. The peripheral modules 1020, 1025, 1030, 1035 transmit the serial data streams to ADAS hub 1015 using the communication channels 1020A, 1025A, 1030A, 1035A. Concurrently, the ADAS hub 1015 may transmit data to the peripheral modules 1020, 1025, 1030, 1035 using the communication channels 1020A, 1025A, 1030A, 1035A. Communications between the ADAS hub 1015 and the peripheral modules 1020, 1025, 1030, 1035 may occur simultaneously. Such multi-directional communications across the same one of the communication channels 1020A, 1025A, 1030A, 1035A are referred to as full duplex communications.

In such example operations of the ADAS system 1005 of FIG. 10, the ADAS hub 1015 receives the serial data streams from the peripheral modules 1020, 1025, 1030, 1035. The ADAS hub 1015 deserializes the data streams to reconstruct the video streams captured by the peripheral modules 1020, 1025, 1030, 1035. The ADAS hub 1015 at least one of stores, processes, or displays the video streams for driver assistance. For example, the ADAS hub 1015 displays the video stream of the peripheral module 1035 on the display 1040 responsive to a determination that the perspective corresponding to the peripheral module 1035 is needed. In another example, the ADAS hub 1015 stores or process video streams of the peripheral modules 1020, 1025, 1030, 1035 for detecting safety hazards in the environment of the vehicle 1000.

Example operations of the ADAS system 1005 are further described in connection with FIG. 11. Advantageously, serializing and deserializing data from the peripheral modules 1020, 1025, 1030, 1035 reduces the number of connections that need to traverse relatively large portions of the vehicle 1000 to the ADAS hub 1015. Advantageously, the serial data streams are capable of accurately traversing relatively large distances across the communication channels 1020A, 1025A, 1030A, 1035A.

Turning now to the IVI system 1010, the media source 1045 is coupled to the IVI driver circuitry 1050. The media source 1045 supplies media to the IVI driver circuitry 1050 for display on one or more of the displays 1060, 1065, 1075. In some examples, the media source 1045 is integrated in the vehicle 1000, such as circuitry supporting a data stream or memory storing media. In other examples, the media source 1045 represents a connection to a device that is external to the vehicle 1000, such as a wireless connection to a service hosting a multi-media stream.

The IVI driver circuitry 1050 is communicatively coupled to the media source 1045 and the display driver 1055. The IVI driver circuitry 1050 processes multi-media data from the media source 1045 for transmission to one or more of the display drivers 1055, 1070. The IVI driver circuitry 1050 uses full duplex communications to transmit data to and receive data from the display driver 1055. In some examples, the IVI driver circuitry 1050 uses LVDS to communicate with the display driver 1055. In such examples, the IVI driver circuitry 1050 indirectly communicates with the display driver 1070 through the display driver 1055. Such an example is further illustrated and described in connection with FIG. 12. Alternatively, the IVI driver circuitry 1050 may use an alternative type of signaling to communicate with the display driver 1055, such as DSI, eDP, etc. An example of the IVI driver circuitry 1050 is further illustrated and described in connection with FIG. 12.

The display driver 1055 is communicatively coupled to the IVI driver circuitry 1050, the displays 1060, 1065, and the display driver 1070. The display driver 1055 receives data from and transmits data to the IVI driver circuitry 1050 using first and second communication channels 1055A, 1055B. The display driver 1055 receives data from and transmits data to the display driver 1070 using third and fourth communication channels 1055C, 1055D. In the example of FIG. 10, first and second coaxial connectors form the communication channels 1055A, 1055B between the IVI driver circuitry 1050 and the display driver 1055. Similarly, third and fourth coaxial connectors form the communication channels 1055C, 1055D between the display drivers 1055, 1070. The display driver 1055 uses multi-lane signaling to display media using the displays 1060, 1065. In some examples, the display driver 1055 determines which of the displays 1060, 1065 corresponds to the data responsive to decoding additional data from the IVI driver circuitry 1050. Alternatively, the display driver 1055 may be coupled to any number of display(s). An example of the display driver 1055 is further illustrated and described in connection with FIG. 12.

The display driver 1070 is communicatively coupled to the display driver 1055 and the display 1075. In some examples, the display driver 1070 may be coupled to another instance of the display driver 1070 (similar to the communication channels 1055A, 1055B, 1055C, 1055D of the display driver 1055). The display driver 1070 receives data from and transmits data to the display driver 1055 using the communication channels 1055C, 1055D. The display driver 1070 uses multi-lane signaling to display multi-media data using the display 1075. Alternatively, the display driver 1070 may be coupled to any number of display(s).

In example operation of the IVI system 1010 of FIG. 10, the media source 1045 supplies media for display on at least one of the displays 1060, 1065, 1075. The IVI driver circuitry 1050 determines one or more of the displays 1060, 1065, 1075 that correspond to the media from the media source 1045. The IVI driver circuitry 1050 determines one or more of the display drivers 1055, 1070 that are coupled to the one or more of the displays 1060, 1065, 1075. The IVI driver circuitry 1050 generates identifying data specifying at least one of the one or more of the display drivers 1055, 1070 or one or more of the displays 1060, 1065, 1075. The IVI driver circuitry 1050 combines the identifying data and the media from the media source 1045. The IVI driver circuitry 1050 serializes the combined data for transmission on at least one of the communication channels 1055A, 1055B.

In such example operations of the IVI system 1010, the display driver 1055 receives the serial data stream representing the media and identifying data. The display driver 1055 deserializes the serial data stream(s) from the communication channels 1055A, 1055B. The display driver 1055 decodes the identifying data to determine if the media corresponds to either of the displays 1060, 1065. The display driver 1055 displays the media on one or more of the displays 1060, 1065 responsive to determining the identifying data specifies the one or more of the displays 1060, 1065. The display driver 1055 reserializes the combined media and identifying data responsive to a determination that the identifying data specifies another display corresponds to the media. The display driver 1055 transmits the serial data on at least one of the communication channels

1055C, 1055D. The display driver 1070 receives the serial data stream representing the media and identifying data from the display driver 1055. The display driver 1055 deserializes the serial data stream(s) from the communication channels 1055C, 1055D. The display driver 1070 decodes the identifying data to determine if the media corresponds to the display 1075. The display driver 1070 displays the media on the display 1075 responsive to determining the identifying data specifics the display 1075. In some examples, the display drivers 1055, 1070 transmit serial data along the communication channels 1055A, 1055B, 1055C, 1055D to the IVI driver circuitry 1050. In such examples, the concurrent communications from the display drivers 1055, 1070 may confirm reception or display of the media on one or more of the displays 1060, 1065, 1075.

Example operations of the IVI system 1010 are further described in connection with FIG. 12. Advantageously, serializing and deserializing media from the media source 1045 reduces the number of connections that need to traverse relatively large portions of the vehicle 1000 to the displays 1060, 1065, 1075. Advantageously, the serial data streams are capable of accurately traversing relatively large distances across the communication channels 1055A, 1055B, 1055C, 1055D.

Figure 11:
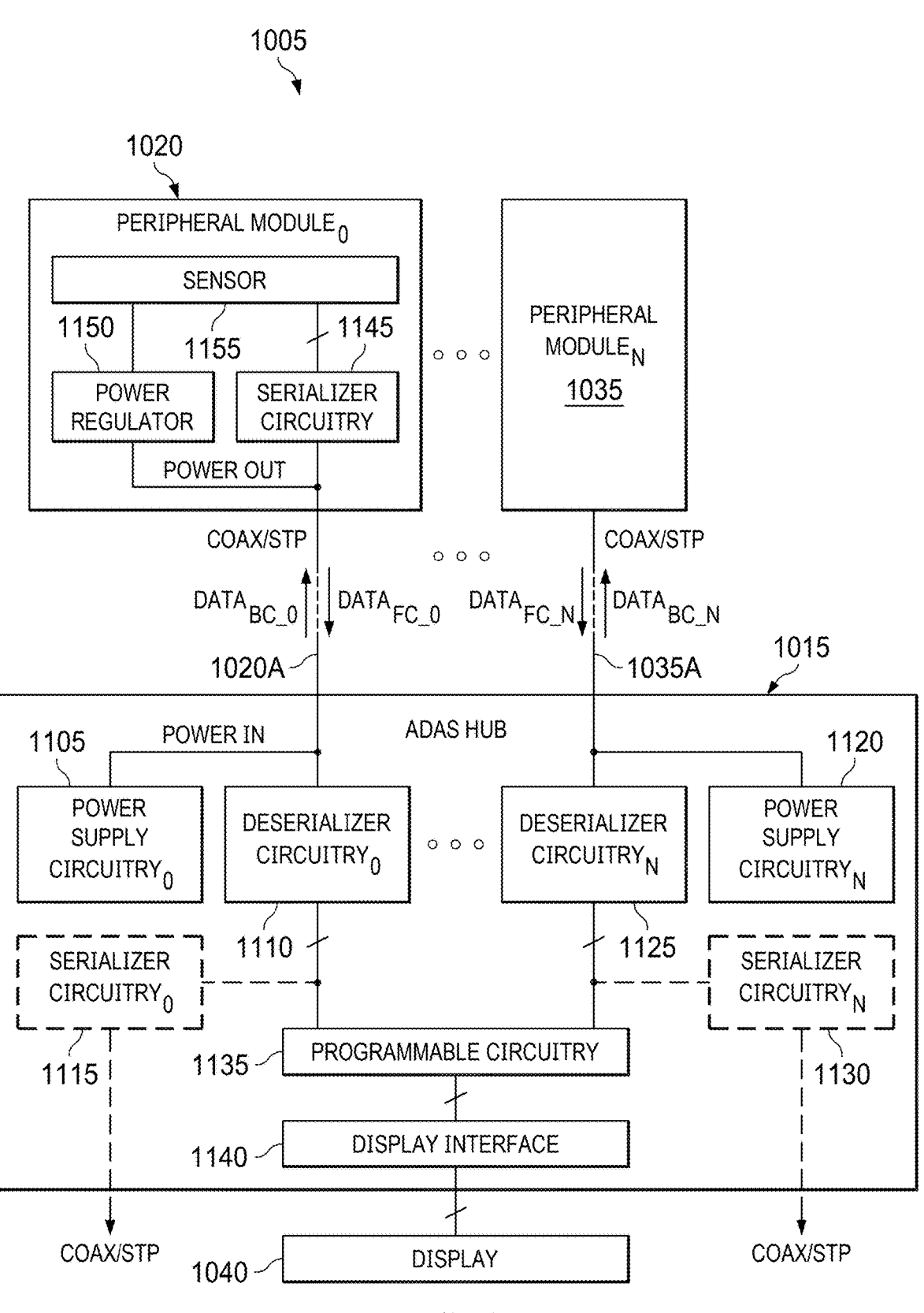
FIG. 11 is a block diagram of an example of the ADAS system of FIG. 10 including an example ADAS hub, an example peripheral module, and an example display, the ADAS hub further including example deserializer circuitry, and the peripheral module further including example serializer circuitry.

FIG. 11 is a block diagram of an example of the ADAS system 1005 of FIG. 10 including an example of the ADAS hub 1015 of FIG. 10 and an example of the peripheral modules 1020, 1035 of FIG. 10, and the display 1040 of FIG. 10. The example ADAS hub 1015 of FIG. 11 includes first example power supply circuitry 1105, first example deserializer circuitry 1110, first example serializer circuitry 1115, second example power supply circuitry 1120, second example deserializer circuitry 1125, second example serializer circuitry 1130, example programmable circuitry 1135, example display interface circuitry 1140. The example peripheral module 1020 of FIG. 11 includes example serializer circuitry 1145, example power regulator circuitry 1150, and an example sensor 1155.

The power supply circuitry 1105 has an output coupled to the communication channel 1020A and the deserializer circuitry 1110. In some examples, the power supply circuitry 1105 has an input coupled to a power storage or an electronic control unit (ECU), which supplies power. In other examples, the power supply circuitry 1105 is in the peripheral module 1020. In such examples, the power supply circuitry 1105 directly supplies power to the peripheral module 1020. Alternatively, a different method of powering the peripheral module 1020 may be used in conjunction with circuitry described herein.

The deserializer circuitry 1110 has an input and outputs. The input of the deserializer circuitry 1110 is coupled to the communication channel 1020A and the power supply circuitry 1105. The outputs of the deserializer circuitry 1110 are coupled to the serializer circuitry 1115 and the programmable circuitry 1135. In some examples, the deserializer circuitry 1110 communicates with the peripheral module 1020 using serial data streams along the communication channel 1020A. An example of the deserializer circuitry 1110 is further illustrated and described in connection with FIG. 13.

The serializer circuitry 1115 has inputs and an output. The inputs of the serializer circuitry 1115 are coupled to the deserializer circuitry 1110 and the programmable circuitry 1135. The output of the serializer circuitry 1115 is structured to be coupled to an additional communication channel. In some examples, as illustrated by the dashed lines, the ADAS hub 1015 may include the serializer circuitry 1115 to connect the ADAS system 1005 to external circuitry. In such examples, the serializer circuitry 1115 may communicatively couple the ADAS system 1005 to another ADAS system, the IVI system 1010, storage medium, an ECU, etc. In other examples, the serializer circuitry 1115 may be excluded from the ADAS hub 1015.

The power supply circuitry 1120 has an output coupled to the communication channel 1035A and the deserializer circuitry 1125. In some examples, the power supply circuitry 1120 has an input coupled to a power storage or an ECU, which supplies power. In other examples, the power supply circuitry 1120 is in the peripheral module 1035. In such examples, the power supply circuitry 1120 directly supplies power to the peripheral module 1035. Alternatively, a different method of powering the peripheral module 1035 may be used in conjunction with circuitry described herein.

The deserializer circuitry 1125 has an input and outputs. The input of the deserializer circuitry 1125 is coupled to the communication channel 1035A and the power supply circuitry 1120. The outputs of the deserializer circuitry 1125 are coupled to the serializer circuitry 1130 and the programmable circuitry 1135. In some examples, the deserializer circuitry 1125 communicates with the peripheral module 1035 using serial data streams along the communication channel 1035A. An example of the deserializer circuitry 1125 is further illustrated and described in connection with FIG. 13.

The serializer circuitry 1130 has inputs and an output. The inputs of the serializer circuitry 1130 are coupled to the deserializer circuitry 1125 and the programmable circuitry 1135. The output of the serializer circuitry 1130 is structured to be coupled to an additional communication channel. In some examples, as illustrated by the dashed lines, the ADAS hub 1015 may include the serializer circuitry 1130 to connect the ADAS system 1005 to external circuitry. In such examples, the serializer circuitry 1130 may communicatively couple the ADAS system 1005 to another ADAS system, the IVI system 1010, storage medium, an ECU, etc. In other examples, the serializer circuitry 1130 may be excluded from the ADAS hub 1015.

The programmable circuitry 1135 has first inputs, second inputs, and outputs. The first inputs of the programmable circuitry 1135 are coupled to the deserializer circuitry 1110 and the serializer circuitry 1115. The second inputs of the programmable circuitry 1135 are coupled to the deserializer circuitry 1125 and the serializer circuitry 1130. The outputs of the programmable circuitry 1135 are coupled to the display interface circuitry 1140. In some examples, the programmable circuitry 1135 instantiates circuitry responsive to an execution of machine-readable instructions. In such examples, the programmable circuitry 1135 may be one of a central processing unit (CPU), a graphic processing unit (GPU), multi-core processing unit (MCU), etc. Alternatively, the programmable circuitry 1135 may be an application specific integrated circuit (ASIC) structured to at least one of store, process, or condition data from the deserializer circuitry 1110, 1125.

The display interface circuitry 1140 has inputs and outputs. The inputs of the display interface circuitry 1140 are coupled to the programmable circuitry 1135. The outputs of the display interface circuitry 1140 are coupled to the display 1040. In some examples, the display interface circuitry 1140 represents a display driver, which converts data from the programmable circuitry 1135 for driving the display 1040. In some such examples, the display interface circuitry 1140 may include a port and connector specific for driving the display 1040, such as a display port, a high-definition multimedia interface (HDMI) port, etc.

The serializer circuitry 1145 has inputs and an output. The inputs of the serializer circuitry 1145 are coupled to the sensor 1155. The output of the serializer circuitry 1145 is coupled to the communication channel 1020A and the power regulator circuitry 1150. In some examples, the serializer circuitry 1145 communicates with the ADAS hub 1015 using serial data streams along the communication channel 1020A. An example of the serializer circuitry 1145 is further illustrated and described in connection with FIG. 13.

In the example of FIG. 11, the deserializer circuitry 1110 is communicatively coupled to the serializer circuitry 1145 by a full duplex wireline connection represented by the communication channel 1020A. In some examples, both the deserializer circuitry 1110 and the serializer circuitry 1145 may receive data from or transmit data on the communication channel 1020A. In such examples, the input of the deserializer circuitry 1110 may also represent an output and the output of the serializer circuitry 1145 may also represent an input. Such an example is further described in connection with FIG. 13.

The power regulator circuitry 1150 has an input and an output. The input of the power regulator circuitry 1150 is coupled to the communication channel 1020A and the serializer circuitry 1145. The output of the power regulator circuitry 1150 is coupled to the sensor 1155. The power regulator circuitry 1150 receives power from the power supply circuitry 1105. In some examples, such as in FIG. 11, the power regulator circuitry 1150 receives power through the communication channel 1020A. In other examples, the power supply circuitry 1105 may be coupled to the power regulator circuitry 1150 by a separate connection or positioned in proximity to the peripheral module 1020.

The sensor 1155 has an input and outputs. The input of sensor 1155 is coupled to the power regulator circuitry 1150. The outputs of the sensor 1155 are coupled to the serializer circuitry 1145. In some examples, the sensor 1155 produces data representative of a surrounding environment. For example, in FIG. 10, the sensor 1155 may be a camera positioned to capture a portion of the environment surrounding the vehicle 1000. In another example, the sensor 1155 may be an alternative type of sensor for representing characteristics of the surrounding environment of the vehicle 1000, such as obstacles.

In example operation, the power supply circuitry 1105 supplies power to the power regulator circuitry 1150 through the communication channel 1020A. In some examples, such as the communication channel 1020A being a coaxial connector, the power supply circuitry 1105 and the power regulator circuitry 1150 implement power over coax (POC). In such examples, the power supply circuitry 1105 supplies power (POWER IN) and the power regulator circuitry 1150 receives power (POWER OUT). The power regulator circuitry 1150 powers the sensor 1155, or more generally the peripheral module 1020 responsive to receiving power from the power supply circuitry 1105. Similarly, the power supply circuitry 1120 may utilize the communication channel 1035A to supply power to the peripheral module 1035.

In example operation, the sensor 1155 generates data representing the surrounding environment. In some examples, the sensor 1155 is a camera that produces multimedia data representing a perspective of the surrounding environment. In another example, the sensor 1155 is a lidar device that produces time of flight data representing potential obstacles in the surrounding environment. In yet another example, the sensor 1155 is a radar that produces beamforming data representing the surrounding environment. Alternatively, the sensor 1155 may be an alternative type of sensor that produces an alternative type of data. In such example operations, the sensor 1155 produces sensor data using multiple parallel data paths (also referred to as lines or lanes). The serializer circuitry 1145 serializes data of the multiple parallel data paths to produce a serial data stream having a data rate greater than the data rate of the parallel data paths from the sensor 1155. The serializer circuitry 1145 transmits the serial data stream to the deserializer circuitry 1110 using a front channel of the communication channel 1020A. Such data of the serial data stream is referred to as front channel data ($DATA_{FC\_0}$).

In example operation, the deserializer circuitry 1110 receives the serial data stream after traversing the communication channel 1020A. Concurrently, the deserializer circuitry 1110 may transmit a serial data stream to the serializer circuitry 1145 using a back channel of the communication channel 1020A. Such data is referred to as back-channel data ($DATA_{BC\_0}$). In such examples, the front channel data has a data rate greater than the back-channel data to reduce interference. Such multi-directional communications along the communication channel 1020A are referred to as full-duplex communications. The deserializer circuitry 1110 may use the back channel of the communication channel 1020A to control settings of the sensor 1155 or verify reception of data on the front channel. Similarly, the peripheral module 1035 and the deserializer circuitry 1125 may utilize full-duplex communications along the communication channel 1035A to exchange front and back-channel data ($DATA_{FC\_N}$, $DATA_{BC\_N}$).

In example operation, the deserializer circuitry 1110 deserializes the front channel data to produce multiple parallel data paths. In some examples, the deserializer circuitry 1110 may decode identifying data from the front channel data. In such examples, the serializer circuitry 1115 may serialize and transmit the front channel data to external circuitry responsive to the deserializer circuitry 1110 decoding identifying data corresponding to external circuitry. Advantageously, the serializer circuitry 1115 allows the ADAS system 1005 to be coupled to another instance of the ADAS system 1005, the IVI system 1010, or alternative type of data processing system.

In example operation, the programmable circuitry 1135 at least one of processes, stores, or conditions the data of the multiple parallel data paths for the display 1040. In some examples, the programmable circuitry 1135 combines data from the peripheral modules 1020, 1035 prior to display. For example, the programmable circuitry 1135 may stitch video streams from the peripheral modules 1020, 1035 to display a larger portion of the surrounding environment. In such example operations, the display interface circuitry 1140 structures the data from the programmable circuitry 1135 to drive the display 1040. In some examples, the display interface circuitry 1140 is at least one of a column and row pixel driver. The display 1040 produces a perceivable representation of the data from at least one of the peripheral modules 1020, 1035 responsive to the display interface circuitry 1140.

Example operations of the serializer and deserializer system of the ADAS system 1005 are further described in connection with FIG. 13. Advantageously, serializing and deserializing data from the peripheral modules 1020, 1035 reduces the number of connections that need to traverse relatively large distances to the ADAS hub 1015. Advantageously, the serial data streams are capable of accurately traversing relatively large distances across the communication channels 1020A, 1035A.

Figure 12:
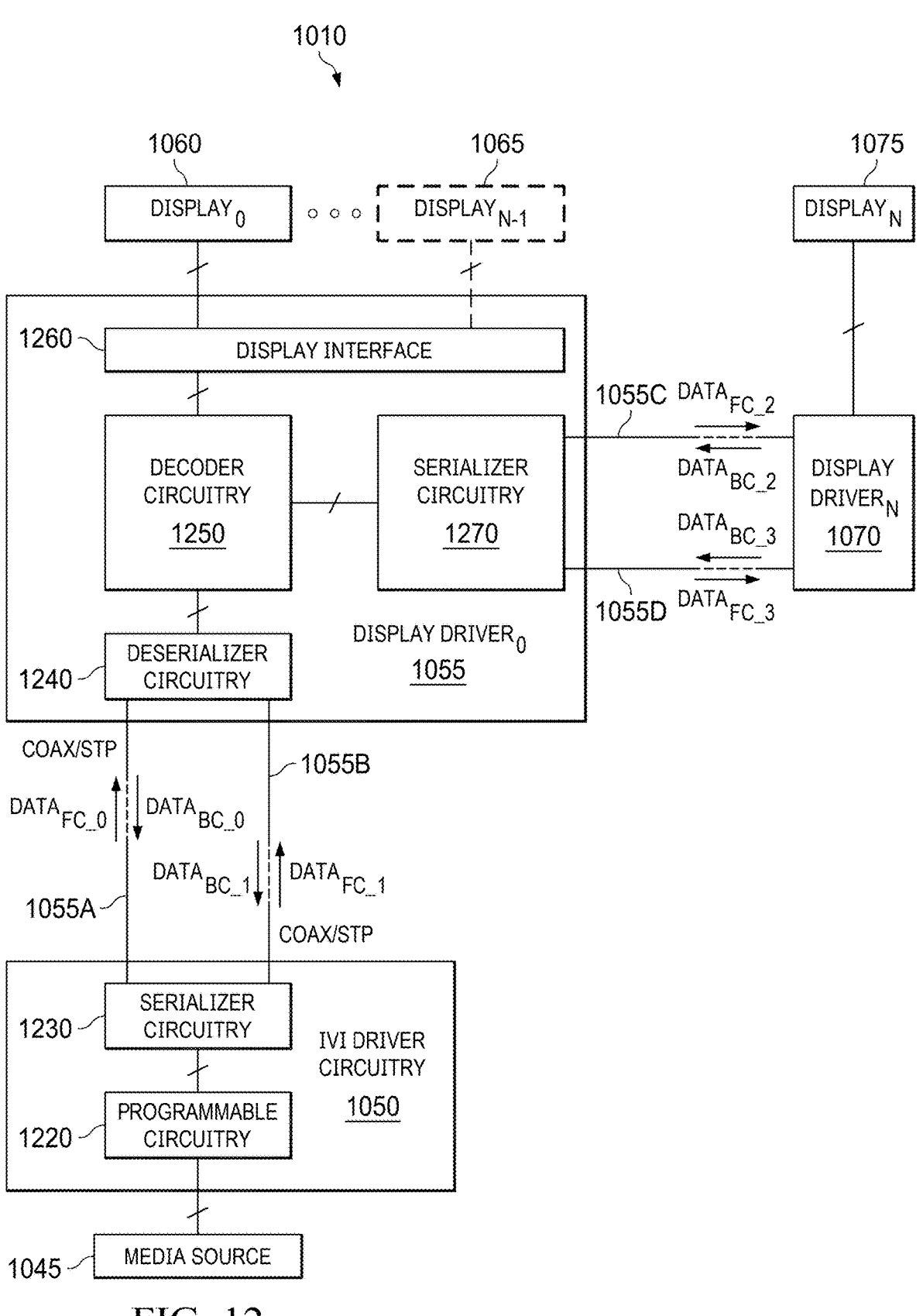
FIG. 12 is a block diagram of an example IVI system including example IVI driver circuitry, an example display driver, and an example display, the IVI driver circuitry including example serializer circuitry, and the display driver including example deserializer circuitry.

FIG. 12 is a block diagram of an example of the IVI system 1010 of FIG. 10 including the media source 1045 of FIG. 10, an example of the IVI driver circuitry 1050 of FIG. 10, an example of the display driver 1055, 1070 of FIG. 10, and the displays 1060, 1065, 1075 of FIG. 10. The example IVI driver circuitry 1050 of FIG. 12 includes example programmable circuitry 1220 and example serializer circuitry 1230. The example display driver 1055 of FIG. 12 includes example deserializer circuitry 1240, example decoder circuitry 1250, example display interface circuitry 1260, and example serializer circuitry 1270.

The programmable circuitry 1220 has an input and outputs. The input of the programmable circuitry 1220 is coupled to the media source 1045. The outputs of the programmable circuitry 1220 are coupled to the serializer circuitry 1230. In some examples, the programmable circuitry 1220 instantiates circuitry responsive to the execution of machine-readable instructions. In such examples, the programmable circuitry 1220 may be one of a CPU, a GPU, an MCU, etc. Alternatively, the programmable circuitry 1135 may be an ASIC structured to at least one of store, process, or condition data from the media source 1045.

The serializer circuitry 1230 has inputs, a first output, and a second output. The inputs of the serializer circuitry 1230 are coupled to the programmable circuitry 1220. The first output of the serializer circuitry 1230 is coupled to the communication channel 1055A. The second output of the serializer circuitry 1230 is coupled to the communication channel 1055B. In some examples, the serializer circuitry 1230 communicates with the display driver 1055 using serial data streams along the communication channels 1055A, 1055B. An example of the serializer circuitry 1230 is further illustrated and described in connection with FIG. 13. Unlike the serializer circuitry 1145 of FIG. 11, the serializer circuitry 1230 exchanges data using multiple serial data streams along the communication channels 1055A, 1055B. In some examples, the serializer circuitry 1230 may be illustrated and described as a plurality of instances of the serializer circuitry 1230 supporting a single one of the communication channels 1055A, 1055B. For example, the serializer circuitry 1230 may be separated into two instances of the serializer circuitry 1230.

The deserializer circuitry 1240 has a first input, a second input, and outputs. The first input of the deserializer circuitry 1240 is coupled to the communication channel 1055A. The second input of the deserializer circuitry 1240 is coupled to the communication channel 1055B. The outputs of the deserializer circuitry 1240 are coupled to the decoder circuitry 1250. In some examples, the deserializer circuitry 1240 communicates with the IVI driver circuitry 1050 using serial data streams along the communication channels 1055A, 1055B. An example of the deserializer circuitry 1240 is further illustrated and described in connection with FIG. 13. Unlike the deserializer circuitry 1110, 1125 of FIG. 11, the deserializer circuitry 1240 exchanges data using multiple serial data streams along the communication channels 1055A, 1055B. In some examples, the deserializer circuitry 1240 may be illustrated and described as a plurality of instances of the deserializer circuitry 1240 supporting a single one of the communication channels 1055A, 1055B. For example, the deserializer circuitry 1240 may be separated into two instances of the deserializer circuitry 1240, such as the deserializer circuitry 1110, 1125 of FIG. 11.

The decoder circuitry 1250 has inputs, first outputs, and second outputs. The inputs of the decoder circuitry 1250 are coupled to the deserializer circuitry 1240. The first outputs of the decoder circuitry 1250 are coupled to the display interface 1260. The second outputs of the decoder circuitry 1250 are coupled to the serializer circuitry 1270. In some examples, the decoder circuitry 1250 is implemented using programmable circuitry or an ASIC. In such examples, the decoder circuitry 1250 is structured to route data from the deserializer circuitry 1240 to at least one of the display interface 1260 or the serializer circuitry 1270 responsive to decoding portions of the data. Such portions of the data from the deserializer circuitry 1240 may be referred to as identifying data, which specifies one or more of the displays 1060, 1065, 1075 to display the media on.

The display interface 1260 has inputs, first outputs, and second outputs. The inputs of the display interface 1260 are coupled to the decoder circuitry 1250. The first outputs of the display interface 1260 are coupled to the display 1060. The second outputs of the display interface 1260 are coupled to the display 1065. In some examples, the display interface 1260 drives one or more of the displays 1060, 1065 responsive to data from the decoder circuitry 1250. In some such examples, the display interface 1260 may include a port and connector specific for driving the displays, such as a display port, an HDMI port, etc. In the example of FIG. 12, the display interface 1260 drives the displays 1060, 1065. Alternatively, the display driver 1055 may include any number of display interfaces 1260 for driving any number of displays, such as the displays 1060, 1065.

The serializer circuitry 1270 has inputs, a first output, and a second output. The inputs of the serializer circuitry 1270 are coupled to the decoder circuitry 1250. The first output of the serializer circuitry 1270 is coupled to the communication channel 1055C. The second output of the serializer circuitry 1270 is coupled to the communication channel 1055D. In some examples, the serializer circuitry 1270 communicates with the display driver 1070 using serial data streams along the communication channels 1055C, 1055D. An example of the serializer circuitry 1270 is further illustrated and described in connection with FIG. 13. Similar to the serializer circuitry 1230, the serializer circuitry 1270 exchanges data using multiple serial data streams along the communication channels 1055C, 1055D. In some examples, the serializer circuitry 1270 may be illustrated and described as a plurality of instances of the serializer circuitry 1270 supporting one of the communication channels 1055C, 1055D. For example, the serializer circuitry 1270 may be separated into two instances of the serializer circuitry 1270.

In example operation, the programmable circuitry 1220 receives multimedia data from the media source 1045. In some examples, the media source 1045 is internal to the IVI system 1010, such as memory storage, an ECU, a media stream, etc. In other examples, the media source 1045 is external to the IVI system 1010, such as a wireless connection to a service hosting a multi-media stream. The programmable circuitry 1220 identifies which of the displays 1060, 1065, 1075 correspond to the data from the media source 1045. In some examples, the programmable circuitry 1220 encodes additional data onto the data from the media source 1045 corresponding to different conditions of the IVI system 1010. For example, the programmable circuitry 1220 adds identifying data into portions of the data from the media source 1045 to specify which of the displays 1060, 1065, 1075 correspond to the media. In such examples, the identifying data may specify one or more of the displays 1060, 1065, 1075. The programmable circuitry 1220 supplies the data to the serializer circuitry 1230 for transmission to the display drivers 1055, 1070.

In example operation, the serializer circuitry 1230 receives data from the programmable circuitry 1220 on multiple parallel data paths. The serializer circuitry 1230 serializes data of the multiple parallel data paths to produce a first and second serial data stream having a data rate greater than the data rate of the parallel data paths from the programmable circuitry 1220. The serializer circuitry 1230 transmits the first serial data stream to the deserializer circuitry 1240 using a front channel of the communication channel 1055A. Such data of the first serial data stream is referred to as first front channel data ($DATA_{FC\_0}$). The serializer circuitry 1230 transmits the second serial data stream to the deserializer circuitry 1240 using a front channel of the communication channel 1055B. Such data of the second serial data stream is referred to as second front channel data ($DATA_{FC\_1}$). Advantageously, increasing the number of communication channels between the serializer circuitry 1230 and the deserializer circuitry 1240 increases the possible number of displays the IVI system 1010 may support at a given time.

In example operation, the deserializer circuitry 1240 receives the first and second serial data streams after traversing the communication channels 1055A, 1055B. Concurrently, the deserializer circuitry 1240 may transmit a first serial data stream to the serializer circuitry 1230 using a back channel of the communication channel 1055A. Such data is referred to as first back-channel data ($DATA_{BC\_0}$). Similarly, the deserializer circuitry 1240 may transmit a second serial data stream to the serializer circuitry 1230 using a back channel of the communication channel 1055B. Such data is referred to as second back-channel data ($DATA_{BC\_1}$). In such examples, the first and second front channel data has a data rate greater than the first and second back-channel data to reduce interference. Such multi-directional communications along the communication channels 1055A, 1055B are referred to as full-duplex communications. The deserializer circuitry 1240 may use the back channel of the communication channels 1055A, 1055B to verify reception of the first and second front channel data, report errors to the programmable circuitry 1220, etc. Similarly, the display driver 1070 and the serializer circuitry 1270 may utilize full-duplex communications along the communication channels 1055C, 1055D to exchange third and fourth front channel data ($DATA_{FC\_2}$, $DATA_{FC\_3}$) and third and fourth back-channel data ($DATA_{BC\_2}$, $DATA_{BC\_3}$).

In example operation, the deserializer circuitry 1240 deserializes the first and second front channel data to produce multiple parallel data paths. The decoder circuitry 1250 decodes the data from the media source 1045 from the additional data from the programmable circuitry 1220. The decoder circuitry 1250 determines which of the displays 1060, 1065, 1075 correspond to the data from the media source 1045 responsive to the decoded data. In some examples, the decoder circuitry 1250 supplies the multiple parallel data paths to the serializer circuitry 1270 responsive to a determination that the media does not correspond to the displays 1060, 1065. In such examples, the serializer circuitry 1270 serializes and transmits the third and fourth front channel data to the display driver 1070. Advantageously, the display driver 1070 may be coupled in series with another instance of the display driver 1070 by additional communication channels, such as a fifth and sixth communication channel.

In example operation, the decoder circuitry supplies the multiple parallel data paths to the display interface 1260 responsive to a determination that the media from the media source 1045 corresponds to at least one of the displays 1060, 1065. In some examples, the display interface 1260 structures the data from the decoder circuitry 1250 to drive the at least of the displays 1060, 1065. In some examples, the display interface 1260 is at least one of a column and row pixel driver. In such example operations, at least one of the displays 1060, 1065 produce a perceivable representation of the media from the media source 1045 responsive to the display interface 1260.

Example operations of the serializer and deserializer system of the IVI system 1010 are further described in connection with FIG. 13. Advantageously, serializing and deserializing data from the media source 1045 reduces the number of connections that need to traverse relatively large distances to one or more of the displays 1060, 1065, 1075. Advantageously, the serial data streams are capable of accurately traversing relatively large distances across the communication channels 1055A, 1055B, 1055C, 1055D.

Figure 13:
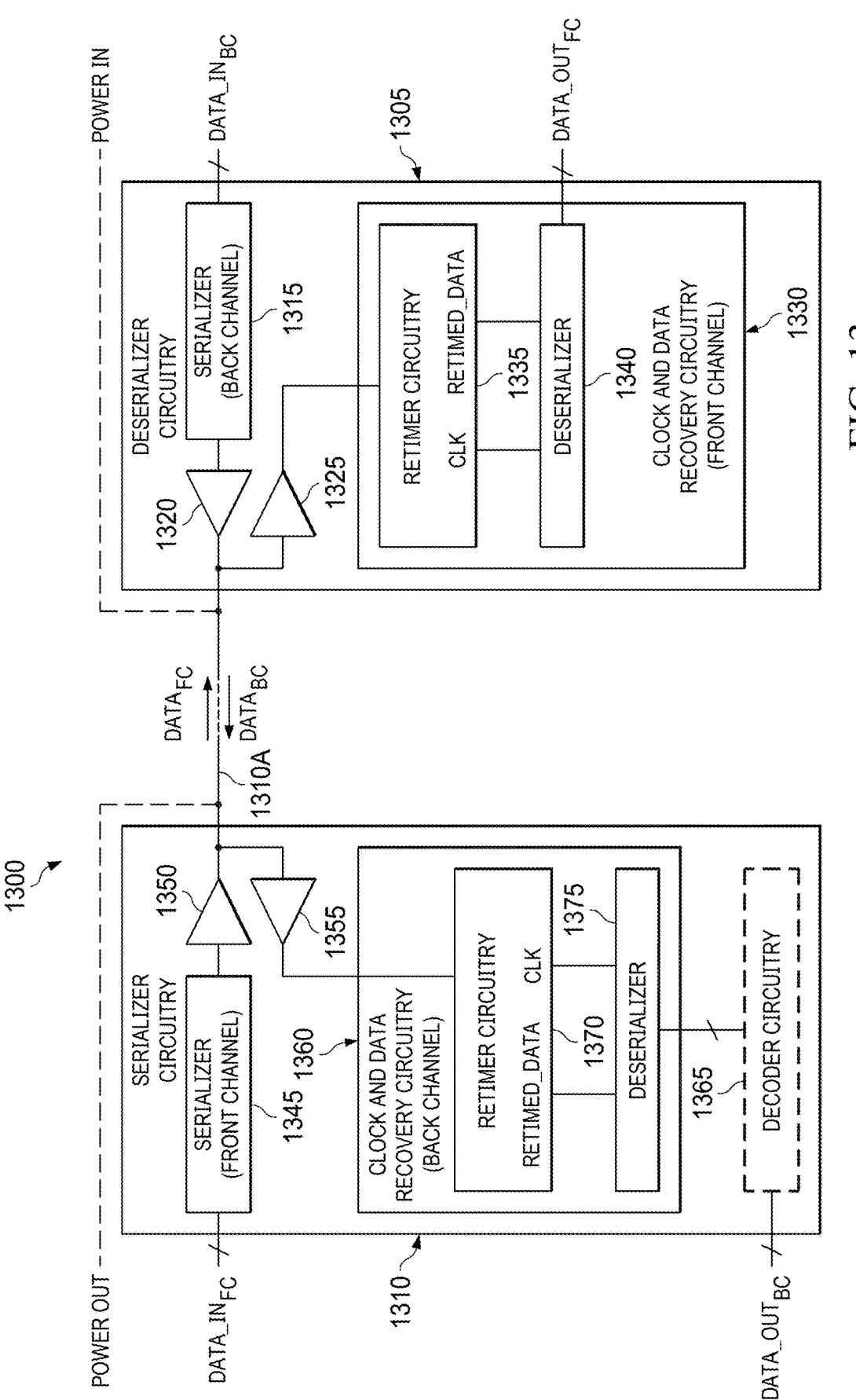
FIG. 13 is a block diagram of an example serial-deserializer (SerDes) system including an example of the serializer circuitry of FIGS. 11 and 12 and an example of the deserializer circuitry of FIGS. 11 and 12, the serializer circuitry and the deserializer circuitry further including retimer circuitry.

FIG. 13 is a block diagram of an example serial-deserializer (SerDes) system 1300 including example deserializer circuitry 1305 and example serializer circuitry 1310. The example deserializer circuitry 1305 of FIG. 13 includes an example serializer circuitry 1315, example transmitter circuitry 1320, example receiver circuitry 1325, and example clock and data recovery (CDR) circuitry 1330. The example CDR circuitry 1330 of FIG. 13 includes example retimer circuitry 1335 and an example deserializer circuitry 1340. The example serializer circuitry 1310 of FIG. 13 includes an example serializer circuitry 1345, example transmitter circuitry 1350, example receiver circuitry 1355, example CDR circuitry 1360, and example decoder circuitry 1365. The example CDR circuitry 1360 of FIG. 13 includes example retimer circuitry 1370 and an example deserializer circuitry 1375.

The SerDes system 1300 is an example interface between the deserializer circuitry 1305 and the serializer circuitry 1310 in both the ADAS system 1005 of FIGS. 10 and 11 and the IVI system 1010 of FIGS. 10 and 12. In the example of the ADAS system 1005 of FIG. 11, the deserializer circuitry 1305 represents the deserializer circuitry 1110 in the ADAS hub 1015 and the serializer circuitry 1310 represents the serializer circuitry 1145 in the peripheral module 1020. In the example of the IVI system 1010 of FIG. 12, the deserializer circuitry 1305 represents the deserializer circuitry 1240 in the display driver 1055. Also, in the example of the IVI system 1010 of FIG. 12, the serializer circuitry 1310 represents the serializer circuitry 1230 in the IVI driver circuitry 1050 or the serializer circuitry 1270 in the display driver 1055.

The deserializer circuitry 1305 is coupled to the serializer circuitry 1310 by the communication channel 1310A. The deserializer circuitry 1305 has inputs (DATA_IN$_{BC}$) and outputs (DATA_OUT$_{FC}$). The inputs and outputs of the deserializer circuitry 1305 are structured to be coupled to one of the programmable circuitry 1135 of FIG. 11 or the decoder circuitry 1250 of FIG. 12. The inputs of the deserializer circuitry 1305 receive back-channel data for transmission along the communication channel 1310A. The outputs of the deserializer circuitry 1305 provide front channel data from the communication channel 1310A.

The serializer circuitry 1310 is coupled to the deserializer circuitry 1305 by the communication channel 1310A. The serializer circuitry 1310 has inputs (DATA_IN$_{FC}$) and outputs (DATA_OUT$_{BC}$). The inputs and outputs of the serializer circuitry 1310 are structured to be coupled to one of the sensor 1155 of FIG. 11 or the programmable circuitry 1220 of FIG. 12. The inputs of the serializer circuitry 1310 receive front channel data for transmission along the communication channel 1310A. The outputs of the serializer circuitry 1310 provide back-channel data from the communication channel 1310A.

The serializer 1315 has inputs and an output. The inputs of the serializer circuitry 1315 are coupled to the inputs of the deserializer circuitry 1305 (DATA_IN$_{BC}$). The output of the serializer circuitry 1315 is coupled to the transmitter circuitry 1320. In some examples, the serializer circuitry 1315 is referred to as a back channel serializer.

The transmitter circuitry 1320 has an input and an output. The input of the transmitter circuitry 1320 is coupled to the serializer circuitry 1315. The output of the transmitter circuitry 1320 is coupled to the communication channel 1310A and the receiver circuitry 1325. In some examples, the transmitter circuitry 1320 is referred to as a back-channel transmitter.

The receiver circuitry 1325 has an input and an output. The input of the receiver circuitry 1325 is coupled to the communication channel 1310A and the transmitter circuitry 1320. The output of the receiver circuitry 1325 is coupled to the CDR circuitry 1330. In some examples, the receiver circuitry 1325 is referred to as a front channel receiver.

The CDR circuitry 1330 has an input and outputs. The input of the CDR circuitry 1330 is coupled to the receiver circuitry 1325. The outputs of the CDR circuitry 1330 are coupled to the outputs of the deserializer circuitry 1305 (DATA_OUT$_{FC}$). In some examples, the CDR circuitry 1330 is referred to as front channel CDR circuitry.

The retimer circuitry 1335 has an input, a first output, and a second output. The input of the retimer circuitry 1335 is coupled to the receiver circuitry 1325. The first and second outputs of the retimer circuitry 1335 are coupled to the deserializer circuitry 1340. An example operations of an LC VCO to implement at least some of the retimer circuitry 1335 is illustrated and described in connection with at least one of FIG. 1, 3, 4A, 7, or 8.

The deserializer 1340 has a first input, a second input, and outputs. The first and second inputs of the deserializer circuitry 1340 are coupled to the retimer circuitry 1335. The outputs of the deserializer circuitry 1340 are coupled to the outputs of the deserializer circuitry 1305 (DATA_OUT$_{FC}$).

The serializer 1345 has inputs and an output. The inputs of the serializer circuitry 1345 are coupled to the inputs of the serializer circuitry 1310 (DATA_IN$_{FC}$). The output of the serializer circuitry 1345 is coupled to the transmitter circuitry 1350. In some examples, the serializer is referred to as a front channel serializer.

The transmitter circuitry 1350 has an input and an output. The input of the transmitter circuitry 1350 is coupled to the serializer circuitry 1345. The output of the transmitter circuitry 1350 is coupled to the communication channel 1310A and the receiver circuitry 1355. In some examples, the transmitter circuitry 1350 is referred to as a front channel transmitter. The transmitter circuitry 1320, 1350 may include circuitry to impedance match the communication channel 1310A to reduce reflections. Also, the transmitter circuitry 1320, 1350 may have different bandwidths.

The receiver circuitry 1355 has an input and an output. The input of the receiver circuitry 1355 is coupled to the communication channel 1310A and the transmitter circuitry 1350. The output of the receiver circuitry 1355 is coupled to the CDR circuitry 1360. In some examples, the receiver circuitry 1355 is referred to as a back-channel receiver.

The CDR circuitry 1360 has an input and outputs. The input of the CDR circuitry 1360 is coupled to the receiver circuitry 1355. The outputs of the CDR circuitry 1360 are coupled to the decoder circuitry 1365. In some examples, the CDR circuitry 1360 is referred to as back-channel CDR circuitry.

The decoder circuitry 1365 has inputs and outputs. The inputs of the decoder circuitry 1365 are coupled to the CDR circuitry 1360. The outputs of the decoder circuitry 1365 are coupled to the outputs of the serializer circuitry 1310 (DATA_OUT$_{BC}$). In some examples, as illustrated by the dashed lines, the outputs of the CDR circuitry 1360 are directly coupled to the outputs of the serializer circuitry 1310 (DATA_OUT$_{BC}$).

The retimer circuitry 1370 has an input, a first output, and a second output. The input of the retimer circuitry 1370 is coupled to the receiver circuitry 1355. The first and second outputs of the retimer circuitry 1370 are coupled to the deserializer circuitry 1375. An example operations of an LC VCO to implement at least some of the retimer circuitry 1370 is illustrated and described in connection with at least one of FIG. 1, 3, 4A, 7, or 8.

The deserializer 1375 has a first input, a second input, and outputs. The first and second inputs of the deserializer circuitry 1375 are coupled to the retimer circuitry 1370. The outputs of the deserializer circuitry 1375 are coupled to the decoder circuitry 1365. In some examples, as illustrated by the dashed lines, the outputs of the deserializer circuitry 1375 are directly coupled to the outputs of the serializer circuitry 1310 (DATA_OUT$_{BC}$).

In example operation, the deserializer circuitry 1305 receives back-channel data (DATA$_{BC}$) on multiple data paths from an external data source, such as the programmable circuitry 1135 or the decoder circuitry 1250. The serializer circuitry 1315 produces a back-channel serial data stream responsive to the back-channel data. The transmitter circuitry 1320 transmits the back-channel data to the serializer circuitry 1310 across the communication channel 1310A. Similarly, the serializer circuitry 1310 receives front channel data (DATA$_{FC}$) on multiple data paths from an external data source, such as the sensor 1155 or the programmable circuitry 1220. The serializer circuitry 1345 produces a front channel serial data stream responsive to the front channel data. The transmitter circuitry 1320 transmits the front channel data to the deserializer circuitry 1305 across the communication channel 1310A. In such example operations, the data rates of the transmissions of the front and back-channel data are different to prevent interference. In some examples, the bandwidth of the transmitter circuitry 1320, which transmits the back channel data, is modified to reduce non-linear gain contributions of the communication channel 1310A. Advantageously, the serializer circuitry 1315, 1345 and the transmitter circuitry 1320, 1350 support full-duplex data transmissions along the communication channel 1310A.

In example operation, the deserializer circuitry 1305 receives the front channel data (DATA$_{FC}$) after propagating along the communication channel 1310A. The receiver circuitry 1325 produces a serial data stream representing the front channel data responsive to signals from the communication channel 1310A. In some examples, the receiver circuitry 1325 isolates the communication channel 1310A from the CDR circuitry 1330. The deserializer circuitry 1305 may include echo cancelation circuitry to reduce contributions of the back-channel data from signals received by the transmitter circuitry 1320. Similarly, the serializer circuitry 1310 receives the back-channel data (DATA$_{BC}$) after propagating along the communication channel 1310A. The receiver circuitry 1355 produces a serial data stream representing the back-channel data responsive to signals from the communication channel 1310A. In some examples, the receiver circuitry 1325 isolates the communication channel 1310A from the CDR circuitry 1330. The serializer circuitry 1310 may include echo cancelation circuitry to reduce contributions of the front channel data from signals received by the transmitter circuitry 1350. Also, the receiver circuitry 1325, 1355 terminate currents of the communication channel 1310A.

In example operation, the CDR circuitry 1330 receives the front channel data from the receiver circuitry 1325. The retimer circuitry 1335 retimes the front channel data to produce retimed front channel data (RETIMED_DATA). The retimer circuitry 1335 produces a clock signal (CLK), which represents an accurate sampling time of the retimed front channel data. The deserializer circuitry 1340 receives the retimed front channel data and the clock signal from the retimer circuitry 1335. The deserializer circuitry 1340 produces multiple parallel data paths representing the front channel data. The outputs of the deserializer circuitry 1305 provide the front channel data to external circuitry, such as the programmable circuitry 1135 or the decoder circuitry 1250. Similarly, the CDR circuitry 1360 receives the back-channel data from the receiver circuitry 1355. The retimer circuitry 1335 produces retimed back-channel data and a clock signal responsive to retiming the back-channel data to the clock signal. The deserializer circuitry 1375 receives the retimed back-channel data and the clock signal from the retimer circuitry 1370. The deserializer circuitry 1375 produces multiple parallel data paths representing the back-channel data. In some such example operations, the decoder circuitry 1365 decodes portions of the back-channel data prior to the outputs of the serializer circuitry 1310 supplying the back-channel data to external circuitry, such as the sensor 1155 or the programmable circuitry 1220.

Example operations of an LC VCO to implement at least some of the retimer circuitry 1335, 1370 is illustrated and described in connection with at least one of FIG. 1, 3, 4A, 7, or 8. Advantageously, serializing and deserializing front and back channel data reduces the number of connections that need to traverse relatively large distances of the communication channel 1310A. Advantageously, the serial data streams are capable of accurately traversing relatively large distances across the communication channels 1310A.

While an example manner of implementing the LC VCO 100 of FIG. 1 is illustrated in FIG. 1, an example manner of implementing the LC VCO 300 of FIG. 3 is illustrated in FIGS. 3 and 4A, and an example manner of implementing the LC VCO 700 of FIG. 7 is illustrated in FIGS. 7 and 8, one or more of the elements, processes, or devices illustrated in FIGS. 1, 3, 4A, 7, and 8 may be combined, divided, re-arranged, omitted, eliminated, or implemented in any other way. Further, the example LC VCO 100 of FIG. 1, the example LC VCO 300 of FIGS. 3 and 4A, and the example LC VCO 700 of FIGS. 7 and 8, may be implemented by hardware alone or by hardware in combination with software and firmware. Thus, for example, any of the example LC VCO 100 of FIG. 1, the example LC VCO 300 of FIGS. 3 and 4A, or the example LC VCO 700 of FIGS. 7 and 8, could be implemented by programmable circuitry in combination with one or more machine-readable instructions such as firmware or software, processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), or field programmable logic device(s) (FPLD(s)) such as FPGAs. Further still, the example LC VCO 100 of FIG. 1, the example LC VCO 300 of FIGS. 3 and 4A, and the example LC VCO 700 of FIGS. 7 and 8 may include one or more elements, processes, or devices in addition to, or instead of, those illustrated in FIGS. 1, 3, 4A, 7, and 8, or may include more than one of any or all of the illustrated elements, processes, and devices.

"Including" and "comprising" (and all forms and tenses thereof) are used herein to be open ended terms. Thus, whenever a claim employs any form of "include" or "comprise" as a preamble or within a claim recitation of any kind, additional elements, terms, etc., may be present without falling outside the scope of the corresponding claim or recitation. Example forms of "include" and "comprise" include comprise, include, comprises, includes, comprising, including, having, etc. As used herein, when the phrase "at least" is used as the transition term in, for example, a preamble of a claim, it is open-ended in the same manner as the term "comprising" and "including" are open ended. As used herein in the context of describing structures, components, items, objects and things, the phrase "at least one of A and B" refers to implementations including any of (1) at least one A, (2) at least one B, or (3) at least one A and at least one B. Similarly, as used herein in the context of describing structures, components, items, objects and things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references do not exclude a plurality. Examples of singular references include "a," "an," "first," "second," etc. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, for example, the same entity or object. Also, although individual features may be included in different examples or claims, these may possibly be combined, and the inclusion in different examples or claims does not imply that a combination of features is at least one of not feasible or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of referencing at least one of a semiconductor device, such as a transistor, a semiconductor die containing a semiconductor device, or an integrated circuit (IC) package containing a semiconductor die during fabrication or manufacturing, "above" is not with reference to Earth, but instead is with reference to an underlying substrate on which relevant components are fabricated, assembled, mounted, supported, or otherwise provided. Thus, as used herein and unless otherwise stated or implied from the context, a first component within a semiconductor die, such as a transistor or other semiconductor device, is "above" a second component within the semiconductor die when the first component is farther away from a substrate, such as a semiconductor wafer, during fabrication/manufacturing than the second component on which the two components are fabricated or otherwise provided. Similarly, unless otherwise stated or implied from the context, a first component within an IC package, such as a semiconductor die, is "above" a second component within the IC package during fabrication when the first component is farther away from a printed circuit board (PCB) to which the IC package is to be mounted or attached. Semiconductor devices are often used in orientation different than their orientation during fabrication. Thus, when referring to one of or a combination of a semiconductor device, such as a transistor, a semiconductor die containing a semiconductor device, or an integrated circuit (IC) package containing a semiconductor die during use, the definition of "above" in the preceding paragraph will likely govern based on the usage context. For example, the term "above," as defined in the preceding paragraph, describes the relationship of two parts relative to Earth.

As used in this patent, stating that any part, such as a layer, film, area, region, or plate, is in any way on, positioned on, located on, disposed on, formed on, etc. another part, indicates that the referenced part is either in contact with the other part, or that the referenced part is above the other part with one or more intermediate part(s) located therebetween.

As used herein, connection references, such as attached, coupled, connected, and joined, may include intermediate members between the elements referenced by at least one of the connection reference or relative movement between those elements unless otherwise indicated. As such, connection references do not necessarily infer that two elements are directly connected or in fixed relation to each other.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion, for example, within a claim, in which the elements might, for example, otherwise share a same name.

As used herein, the phrase "in communication," including variations thereof, encompasses one of or a combination of direct communication or indirect communication through one or more intermediary components, and does not require direct physical, such as wired, communication or constant communication, but rather also includes selective communication at least one of periodic intervals, scheduled intervals, aperiodic intervals, or one-time events. Also, as used herein, the phrase "responsive to" can be used interchangeably with the phrase "based on."

As used herein, "programmable circuitry" is defined to include at least one of (i) one or more special purpose electrical circuits, such as an application specific circuit (ASIC), structured to perform specific operation(s) and including one or more semiconductor-based logic devices, such as electrical hardware implemented by one or more transistors, or (ii) one or more general purpose semiconductor-based electrical circuits programmable with instructions to perform one or more specific functions(s) or operation(s) and including one or more semiconductor-based logic devices, such as electrical hardware implemented by one or more transistors. Examples of programmable circuitry include programmable microprocessors such as Central Processor Units (CPUs) that may execute first instructions to perform one or more operations or functions, Field Programmable Gate Arrays (FPGAs) that may be programmed with second instructions to at least one of configure or structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogenous computing system including multiple types of programmable circuitry, such as one or more FPGAs, one or more CPUs, one or more GPUs, one or more NPUs, one or more DSPs, etc., and any combination(s) thereof, and orchestration technology, such as application programming interface(s) (API(s)), that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured, for example at least one of programmed or hardwired, at a time of manufacturing by a manufacturer to at least one of perform the function or be configurable (or re-configurable) by a user after manufacturing to perform the function/or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as at least one of voltage sources or current sources) may instead include only the semiconductor elements within a single physical device, such as at least one of a semiconductor die or integrated circuit (IC) package, and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description.

As used herein, "approximately," "about," and "substantially" modify their subjects/values to recognize the potential presence of variations that occur in real world applications. For example, "approximately" and "about" may modify dimensions that may not be exact due to at least one of manufacturing tolerances or other real-world imperfections. Unless otherwise stated, "about," "approximately," or "substantially" preceding a value means +/−10 percent of the stated value, or, if the value is zero, a reasonable range of values around zero.

Modifications are possible in the described examples, and other examples are possible, within the scope of the claims.

From the foregoing, it will be appreciated that example systems, apparatus, articles of manufacture, and methods have been described for a multi-band hybrid inductor-capacitor voltage-controlled oscillator. As described herein, inductance tuning is performed via current mirroring from a main core, also referred to as a main LC tank circuit, into one or more peripheral cores, also referred to as a peripheral LC tank circuits. Example peripheral cores are mutually coupled to the main core via mutual inductance coupling. As such, the overall inductance of example LC VCOs described herein is controlled by mirroring in-phase and out-of-phase current into one or more peripheral cores, resulting in either negative or positive mutual inductance which also affects the oscillation frequency.

As described herein the phase of injected current is controlled by a tuning signal, also referred to as a control signal, that allows a user to change the sign of the resonance of a peripheral tank circuit. As such, the inductance of example LC VCOs described herein can be increased or decreased by injecting proportional positive or negative phase current into a peripheral core via a tuning signal of one or zero, resulting in increase or decrease in oscillation frequency, respectively. As a result of the single differential output structure of example LC VCOs described herein, clock multiplexing between multiple LC VCOs, which consumes a large amount of power, is avoided. Thus, example LC VCOs described herein reduce power consumption, clock distortion, such as duty cycle distortion, supply noise, etc., and reduced routing complexity as compared to other LC VCOs.

Described systems, apparatus, articles of manufacture, and methods improve the efficiency of using a computing device by reducing the amount of area on a chip and power consumed by an LC VCO as compared to other LC VCOs. For example, examples described herein include an LC VCO with a single differential clock that has an ultra-wide frequency tuning range. As such, example LC VCOs described herein consume about the same amount of area on a chip as a single LC VCO while providing an operational frequency range comparable to that of multiple LC VCOs including multiplexed outputs. However, example LC VCOs described herein do not include multiplexed outputs from multiple LC VCOs and as such avoid routing complexity as well as re-distribution buffers for such multiplexing. Described systems, apparatus, articles of manufacture, and methods are also directed to one or more improvement(s) in the operation of a machine such as a computer or other electronic, electromechanical, or mechanical device.

What is claimed is:

1. An apparatus comprising:

an inverter having a first terminal and a second terminal coupled to an enable terminal;

a first transistor having a control terminal, a first terminal, and a second terminal, the control terminal coupled to the first terminal of the inverter, the first terminal coupled to a supply terminal;

a second transistor having a control terminal, a first terminal, and a second terminal, the first terminal coupled to the second terminal of the first transistor;

an inductor having a first terminal coupled to the second terminal of the second transistor and a second terminal coupled to the control terminal of the second transistor;

a capacitor having a first terminal coupled to the second terminal of the second transistor and a second terminal coupled to the control terminal of the second transistor;

a third transistor having a control terminal, a first terminal, and a second terminal, the control terminal coupled to the first terminal of the inductor and the first terminal of the capacitor, the second terminal coupled to the second terminal of the inductor and the second terminal of the capacitor; and a fourth transistor having a control terminal coupled to the enable terminal, a first terminal coupled to a ground terminal, and a second terminal coupled to the first terminal of the third transistor.

2. The apparatus of claim 1, the inverter is a first inverter, the inductor is a first inductor, the capacitor is a first capacitor, and the apparatus further includes:

a second inverter having a first terminal and a second terminal coupled to a tuning terminal;

a fifth transistor having a control terminal, a first terminal, and a second terminal, the control terminal coupled to the first terminal of the second inverter, the first terminal coupled to the supply terminal;

a sixth transistor having a control terminal, a first terminal, and a second terminal, the control terminal coupled to the first terminal of the first inductor and the first terminal of the first capacitor, the first terminal coupled to the second terminal of the fifth transistor;

a second inductor having a first terminal and a second terminal, the first terminal coupled to the second terminal of the sixth transistor;

a second capacitor having a first terminal coupled to the second terminal of the sixth transistor and the first terminal of the second inductor and a second terminal coupled to the second terminal of the second inductor;

a seventh transistor having a control terminal, a first terminal, and a second terminal, the control terminal coupled to the second terminal of the first inductor and the second terminal of the first capacitor, the second terminal coupled to the second terminal of the second inductor and the second terminal of the second capacitor; and an eighth transistor having a control terminal coupled to the tuning terminal, a first terminal coupled to the ground terminal, and a second terminal coupled to the first terminal of the seventh transistor.

3. The apparatus of claim 2, wherein:

the first inductor and the first capacitor are configured to operate as a first LC tank circuit that is configured to generate a first oscillating signal based on an enable signal at the enable terminal; and the second inductor and the second capacitor are configured to operate as a second LC tank circuit that is configured to generate a second oscillating signal based on a control signal at the tuning terminal, the second oscillating signal to adjust a frequency of the first oscillating signal based on a coupling factor between the first inductor and the second inductor.

4. The apparatus of claim 2, further including:

a ninth transistor having a control terminal, a first terminal, and a second terminal, the control terminal coupled to the tuning terminal, the first terminal coupled to the supply terminal;

a tenth transistor having a control terminal coupled to the second terminal of the first inductor and the second terminal of the first capacitor, a first terminal coupled to the second terminal of the ninth transistor, and a second terminal coupled to the first terminal of the second inductor and the first terminal of the second capacitor;

an eleventh transistor having a control terminal, a first terminal, and a second terminal, the control terminal coupled to the first terminal of the first inductor and the first terminal of the first capacitor, the second terminal coupled to the second terminal of the second inductor and the second terminal of the second capacitor; and a twelfth transistor having a control terminal coupled to the first terminal of the second inverter, a first terminal coupled to the ground terminal, and a second terminal coupled to the first terminal of the eleventh transistor.

5. The apparatus of claim 4, wherein:

the first inductor and the first capacitor are configured to operate as a first LC tank circuit that is configured to generate a first oscillating signal when an enable signal at the enable terminal has a logic value of one; and the second inductor and the second capacitor are configured to operate as a second LC tank circuit that is configured to:

generate a second oscillating signal out-of-phase with the first oscillating signal when a control signal at the tuning terminal has a logic value of one, the second oscillating signal to increase a frequency of the first oscillating signal based on a coupling factor between the first inductor and the second inductor; and generate the second oscillating signal in-phase with the first oscillating signal when the control signal at the tuning terminal has a logic value of zero, the second oscillating signal to decrease the frequency of the first oscillating signal based on the coupling factor.

6. The apparatus of claim 2, wherein the first inductor is inductively coupled via a mutual inductance to the second inductor.

7. The apparatus of claim 2, wherein the second inductor is physically nested within the first inductor.

8. An inductor-capacitor (LC) oscillator comprising:

a first inverter having a first terminal and a second terminal coupled to an enable terminal;

a first core including:

a first transistor having a control terminal, a first terminal, and a second terminal, the control terminal coupled to the first terminal of the first inverter, the first terminal coupled to a supply terminal;

a first LC tank circuit including a first inductor and a first capacitor, the first LC tank circuit having a first terminal and a second terminal across which a clock signal is to be measured; and a second transistor having a control terminal, a first terminal, and a second terminal, the control terminal coupled to the enable terminal, the first terminal coupled to a ground terminal;

a second inverter having a first terminal and a second terminal coupled to a tuning terminal; and a second core including:

a third transistor having a control terminal, a first terminal, and a second terminal, the control terminal coupled to the first terminal of the second inverter, the first terminal coupled to the supply terminal;

a fourth transistor having a control terminal, a first terminal, and a second terminal, the control terminal coupled to the first terminal of the first LC tank circuit, the first terminal coupled to the second terminal of the third transistor;

a second LC tank circuit including a second inductor and a second capacitor, the second LC tank circuit having a first terminal and a second terminal, the first terminal coupled to the second terminal of the fourth transistor; and a fifth transistor having a control terminal, a first terminal, and a second terminal, the control terminal coupled to the second terminal of the first LC tank circuit, the second terminal coupled to the second terminal of the second LC tank circuit; and a sixth transistor having a control terminal coupled to the tuning terminal, a first terminal coupled to the ground terminal, and a second terminal coupled to the first terminal of the fifth transistor, the first inductor being inductively coupled via a mutual inductance to the second inductor.

9. The LC oscillator of claim 8, wherein:

the first core is to generate a first oscillating signal based on an enable signal at the enable terminal; and the second core is to generate a second oscillating signal based on a control signal at the tuning terminal, the second oscillating signal to adjust a frequency of the first oscillating signal based on a coupling factor between the first inductor of the first LC tank circuit and the second inductor of the second LC tank circuit.

10. The LC oscillator of claim 8, wherein:

the first core is to generate a first oscillating signal when an enable signal at the enable terminal has a logic value of one; and the second core is to:

generate a second oscillating signal out-of-phase with the first oscillating signal when a control signal at the tuning terminal has a logic value of one, the second oscillating signal to increase a frequency of the first oscillating signal based on a coupling factor between the first inductor of the first LC tank circuit and the second inductor of the second LC tank circuit; and generate the second oscillating signal in-phase with the first oscillating signal when the control signal at the tuning terminal has a logic value of zero, the second oscillating signal to decrease the frequency of the first oscillating signal based on the coupling factor.

11. The LC oscillator of claim 8, further including a buffer having a first terminal coupled to a clock terminal, a second terminal coupled to the first terminal of the first LC tank circuit, and a third terminal coupled to the second terminal of the first LC tank circuit.

12. The LC oscillator of claim 8, wherein the second inductor is physically nested within the first inductor.

13. The LC oscillator of claim 8, wherein an inductance of the LC oscillator is adjustable based on a control signal at the tuning terminal.

14. A phase-locked loop (PLL) oscillator comprising:

a phase comparator circuit having a terminal;

a filter circuit having a first terminal and a second terminal coupled to the terminal of the phase comparator circuit; and an inductor-capacitor (LC) voltage-controlled oscillator (VCO) including:

an inverter having a first terminal and a second terminal coupled to the first terminal of the filter circuit;

a first transistor having a control terminal, a first terminal, and a second terminal, the control terminal coupled to the first terminal of the inverter, the first terminal coupled to a supply terminal;

a second transistor having a control terminal, a first terminal, and a second terminal, the first terminal coupled to the second terminal of the first transistor;

an inductor having a first terminal coupled to the second terminal of the second transistor and a second terminal coupled to the second transistor;

a capacitor having a first terminal coupled to the second terminal of the second transistor and a second terminal coupled to the control terminal of the second transistor;

a third transistor having a control terminal, a first terminal, and a second terminal, the control terminal coupled to the first terminal of the inductor and the first terminal of the capacitor, the second terminal coupled to the second terminal of the inductor and the second terminal of the capacitor; and a fourth transistor having a control terminal coupled to the first terminal of the filter circuit, a first terminal coupled to a ground terminal, and a second terminal coupled to the first terminal of the third transistor.

15. The PLL oscillator of claim 14, wherein the PLL oscillator includes a tuning terminal, the inverter is a first inverter, the inductor is a first inductor, the capacitor is a first capacitor, and the LC VCO further includes:

a second inverter having a first terminal and a second terminal coupled to the tuning terminal of the PLL oscillator;

a fifth transistor having a control terminal, a first terminal, and a second terminal, the control terminal coupled to the first terminal of the second inverter, the first terminal coupled to the supply terminal;

a sixth transistor having a control terminal, a first terminal, and a second terminal, the control terminal coupled to the first terminal of the first inductor and the first terminal of the first capacitor, the first terminal coupled to the second terminal of the fifth transistor;

a second inductor having a first terminal and a second terminal, the first terminal coupled to the second terminal of the sixth transistor;

a second capacitor having a first terminal coupled to the second terminal of the sixth transistor and the first terminal of the second inductor and a second terminal coupled to the second terminal of the second inductor;

a seventh transistor having a control terminal, a first terminal, and a second terminal, the control terminal coupled to the second terminal of the first inductor and the second terminal of the first capacitor, the second terminal coupled to the second terminal of the second inductor and the second terminal of the second capacitor; and an eighth transistor having a control terminal coupled to the tuning terminal, a first terminal coupled to the ground terminal, and a second terminal coupled to the first terminal of the seventh transistor.

16. The PLL oscillator of claim 15, wherein:

the first inductor and the first capacitor are configured to operate as a first LC tank circuit that is configured to generate a first oscillating signal based on a signal at the first terminal of the filter circuit; and the second inductor and the second capacitor are configured to operate as a second LC tank circuit that is configured to generate a second oscillating signal based on a control signal at the tuning terminal, the second oscillating signal to adjust a frequency of the first oscillating signal based on a coupling factor between the first inductor and the second inductor.

17. The PLL oscillator of claim 15, further including:

a ninth transistor having a control terminal, a first terminal, and a second terminal, the control terminal coupled to the tuning terminal, the first terminal coupled to the supply terminal;

a tenth transistor having a control terminal coupled to the second terminal of the first inductor and the second terminal of the first capacitor, a first terminal coupled to the second terminal of the ninth transistor, and a second terminal coupled to the first terminal of the second inductor and the first terminal of the second capacitor;

an eleventh transistor having a control terminal, a first terminal, and a second terminal, the control terminal coupled to the first terminal of the first inductor and the first terminal of the first capacitor, the second terminal coupled to the second terminal of the second inductor and the second terminal of the second capacitor; and a twelfth transistor having a control terminal coupled to the first terminal of the second inverter, a first terminal coupled to the ground terminal, and a second terminal coupled to the first terminal of the eleventh transistor.

18. The PLL oscillator of claim 17, wherein:

the first inductor and the first capacitor are configured to operate as a first LC tank circuit that is configured to generate a first oscillating signal when an output signal at the first terminal of the filter circuit has a logic value of one; and the second inductor and the second capacitor are configured to operate as a second LC tank circuit that is configured to:

generate a second oscillating signal out-of-phase with the first oscillating signal when a control signal at the tuning terminal has a logic value of one, the second oscillating signal to increase a frequency of the first oscillating signal based on a coupling factor between the first inductor and the second inductor; and generate the second oscillating signal in-phase with the first oscillating signal when the control signal at the tuning terminal has a logic value of zero, the second oscillating signal to decrease the frequency of the first oscillating signal based on the coupling factor.

19. The PLL oscillator of claim 15, wherein the first inductor is inductively coupled via a mutual inductance to the second inductor.

20. The PLL oscillator of claim 15, wherein the second inductor is physically nested within the first inductor.

* * * * *